United States Patent
Lee et al.

(10) Patent No.: US 7,894,277 B2
(45) Date of Patent: Feb. 22, 2011

(54) SEMICONDUCTOR DEVICE HAVING RESISTANCE BASED MEMORY ARRAY, METHOD OF READING AND WRITING, AND SYSTEMS ASSOCIATED THEREWITH

(75) Inventors: Kwang Jin Lee, Hwaseong-si (KR); Du Eung Kim, Yongin-si (KR); Hye Jin Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 197 days.

(21) Appl. No.: 12/292,890

(22) Filed: Nov. 28, 2008

(65) Prior Publication Data

US 2009/0141549 A1    Jun. 4, 2009

(30) Foreign Application Priority Data

Dec. 3, 2007  (KR) ...................... 10-2007-0124512

(51) Int. Cl.
G11C 7/00 (2006.01)
(52) U.S. Cl. ............... 365/189.05; 365/148; 365/230.8; 365/233.1
(58) Field of Classification Search ................. 365/148, 365/189.05, 230.08, 233.1
See application file for complete search history.

(56) References Cited

U.S. PATENT DOCUMENTS

| 6,351,406 | B1 | 2/2002 | Johnson et al. |
| 6,545,906 | B1 | 4/2003 | Savtchenko et al. |
| 6,849,891 | B1 | 2/2005 | Hsu et al. |
| 7,038,961 | B2 | 5/2006 | Sakata et al. |
| 7,282,759 | B2 | 10/2007 | Kim et al. |
| 2003/0093744 | A1* | 5/2003 | Leung et al. ................ 714/763 |
| 2007/0195582 | A1 | 8/2007 | Sakata et al. |

OTHER PUBLICATIONS

K. Pagiamtzis et al., "Content-Addressable Memory (CAM) Circuits and Architectures: A Tutorial and Survey Content- addressable memory", Wikipedia article, Apr. 26, 2008.

* cited by examiner

*Primary Examiner*—Hoai V Ho
(74) *Attorney, Agent, or Firm*—Harness, Dickey & Pierce

(57) ABSTRACT

At least one embodiment includes a non-volatile memory cell array, a write buffer configured to store data being written into the non-volatile memory cell array, and a write unit configured to write data into the non-volatile memory cell array. The write unit is configured to perform writing of data such that each data will have reached a stable storage state in the non-volatile memory prior to being over-written in the write buffer.

13 Claims, 29 Drawing Sheets

FIG. 2

| | 10_1 | 10_2 | 10_3 | 10_4 | 10_5 | 10_6 | 10_7 | 10_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |

FIG. 4

| ENTRY | Vflag |
|---|---|
| 1st WADDR | 1 |
| 2nd WADDR | 1 |
| 3rd WADDR | 1 |
| 4th WADDR | 1 |
| ... | |
| (m-1)th WADDR | 1 |
| mth WADDR | 1 |

124

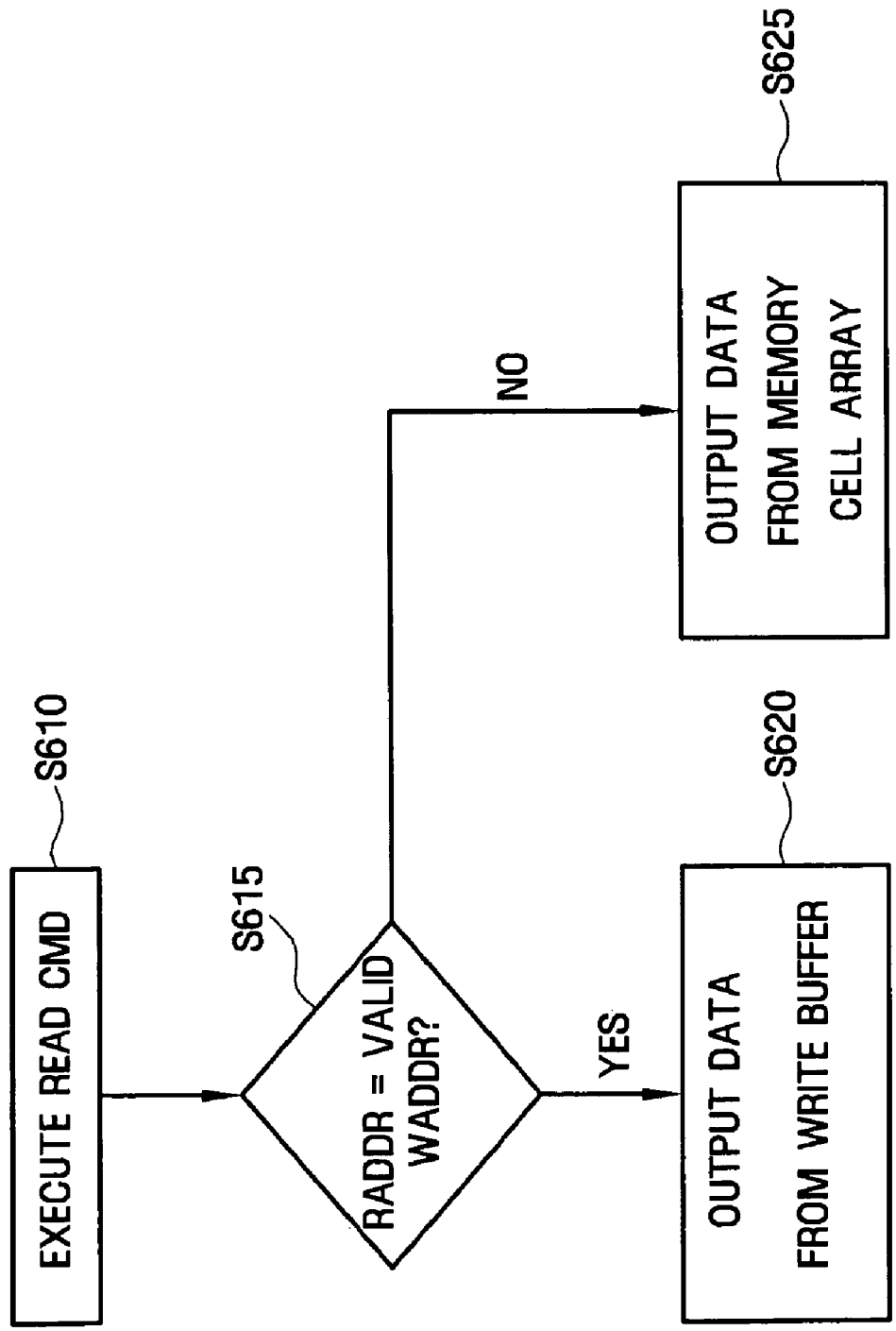

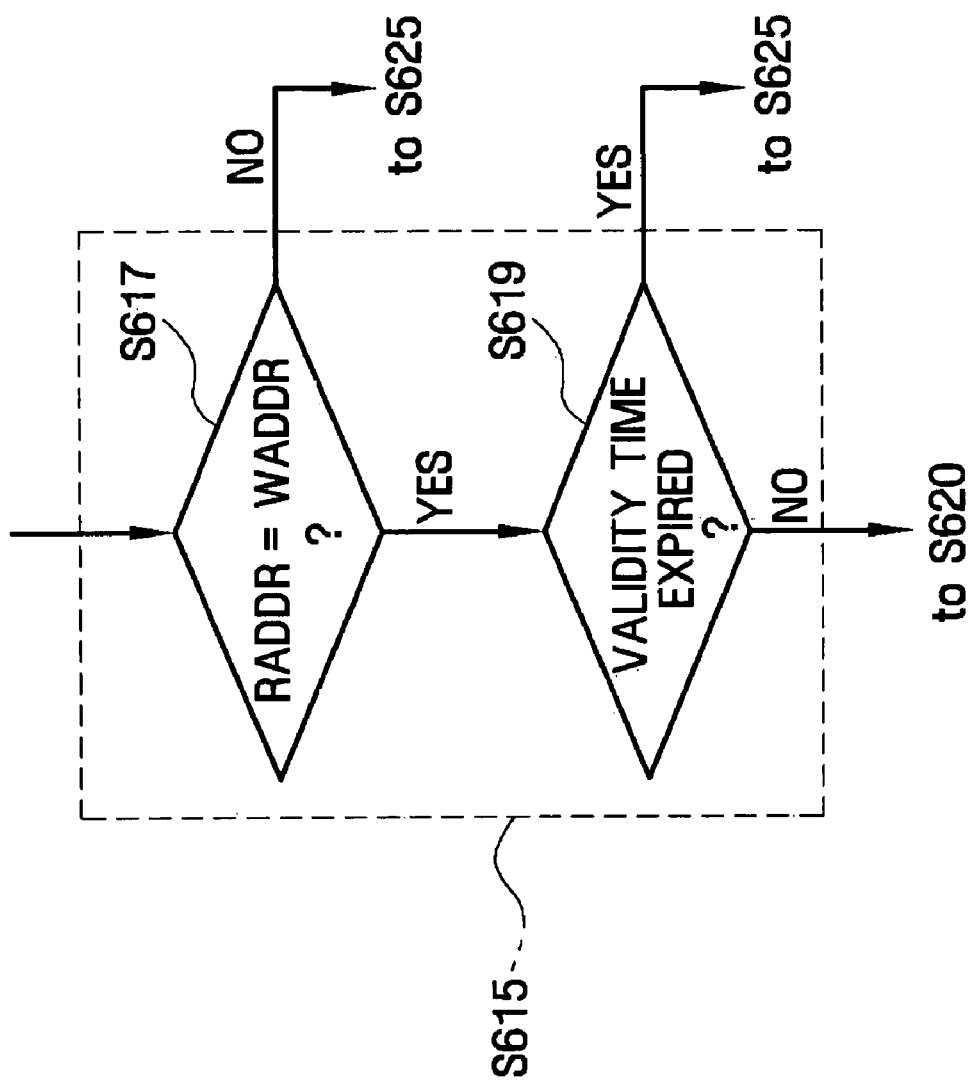

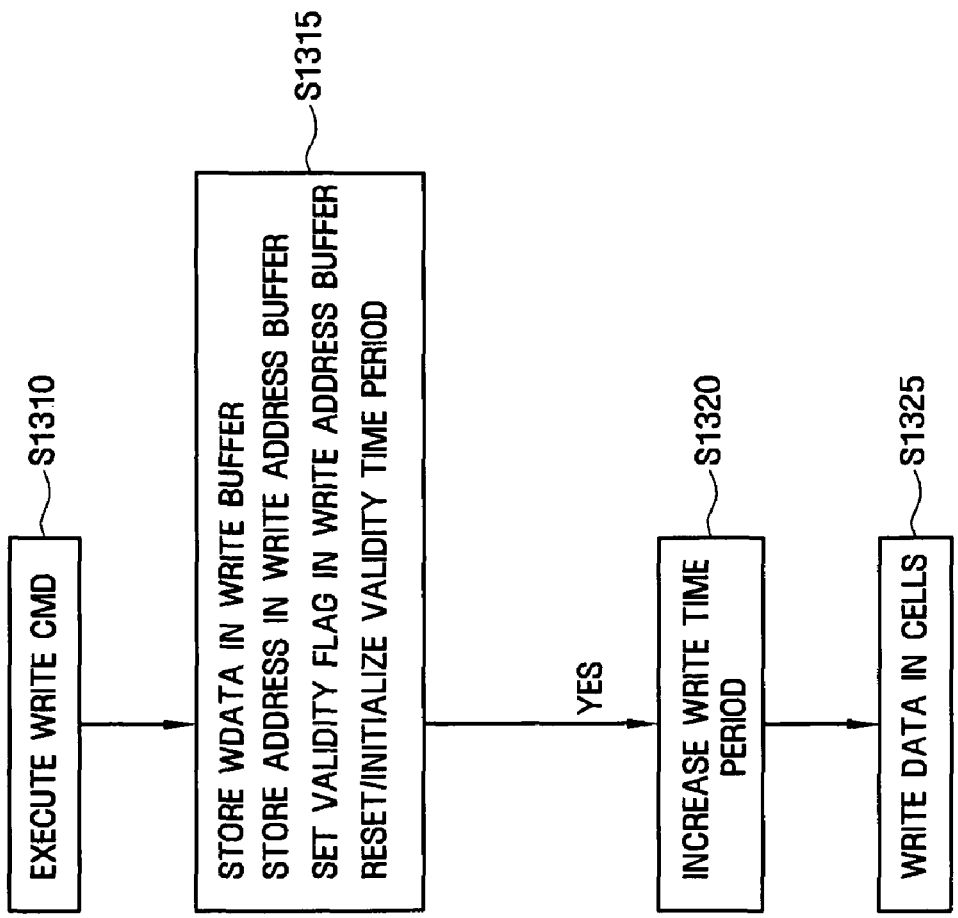

SEMICONDUCTOR DEVICE HAVING RESISTANCE BASED MEMORY ARRAY, METHOD OF READING AND WRITING, AND SYSTEMS ASSOCIATED THEREWITH

PRIORITY INFORMATION

The subject application claims priority under 35 U.S.C. 119 on Korean application no. 10-2007-0124512 filed Dec. 3, 2007; the contents of which are hereby incorporated by reference in their entirety.

CROSS REFERENCE TO RELATED APPLICATIONS

The subject application is related to co-pending application Nos. 12/292,891, 12/292,897, and 12/292,896, all of which are hereby incorporated by reference in their entirety.

BACKGROUND

Embodiments relate to semiconductor devices having a resistance based memory array. For example, a resistance based memory array may be a PRAM (phase change material RAM), RRAM (resistive RAM), MRAM (magnetic RAM), etc.

SUMMARY OF THE INVENTION

One or more example embodiments relate to a semiconductor device.

In one embodiment, the semiconductor device includes a first non-volatile memory cell array, a write buffer configured to store data being written into the non-volatile memory cell array, an address buffer configured to store an address associated with each data stored in the write buffer, and a timing circuit configured to measure at least a first time period. An output circuit is configured to selectively output one of data read from the non-volatile memory array and data from the write buffer, and a by-pass control circuit is configured to control the output circuit based on output from the timing circuit, a received read address and content of the address buffer.

Another embodiment includes a non-volatile memory cell array, a write buffer configured to store data being written into the non-volatile memory cell array, and an address buffer configured to store an address associated with each data stored in the write buffer. The address buffer is configured to output a indicator signal if a last memory location in the address buffer has been filled and the address in the last memory location is a valid. A timing circuit is configured to measure at least a first time period. A write circuit is configured to write data into the non-volatile memory cell array, and the write circuit is configured to increase a time to write data based on the first time period in response to the indicator signal.

A further embodiment includes a non-volatile memory cell array, a write buffer configured to store data being written into the non-volatile memory cell array, and a write unit configured to write data into the non-volatile memory cell array. The write unit is configured to selectively increase a time to write data filling a last location in the write buffer as compared to a time to write data filling other locations in the write buffer.

A still further embodiment includes a non-volatile memory cell array, a write buffer configured to store data being written into the non-volatile memory cell array, and a write unit configured to write data into the non-volatile memory cell array. The write unit is configured to perform writing of data such that each data will have reached a stable storage state in the non-volatile memory prior to being over-written in the write buffer.

One or more embodiments further relate to semiconductor device implementations.

For example, one embodiment is direct to a card. The card includes a memory. The memory has a non-volatile memory cell array, a write buffer configured to store data being written into the non-volatile memory cell array, and a write unit configured to write data into the non-volatile memory cell array. The write unit is configured to perform writing of data such that each data will have reached a stable storage state in the non-volatile memory prior to being over-written in the write buffer. The card further includes a control unit configured to control the memory.

Another embodiment is directed to a system. The system includes a bus, a semiconductor device connected to the bus, an input/output device connected to the bus, and a processor connected to the bus. The processor is configured to communicate with the input/output device and the semiconductor device via the bus. The semiconductor device includes a non-volatile memory cell array, a write buffer configured to store data being written into the non-volatile memory cell array, and a write unit configured to write data into the non-volatile memory cell array, and the write unit configured to perform writing of data such that each data will have reached a stable storage state in the non-volatile memory prior to being over-written in the write buffer.

One or more embodiments still further relate to a method of reading data from a semiconductor device.

One embodiment includes storing data being written into a non-volatile memory cell array in a write buffer, storing an address associated with the stored data in an address buffer and measuring at least a first time period. One of data read from the non-volatile memory cell array and data from the write buffer is selectively output based on the first time period, a received read address and content of the address buffer.

Another embodiment includes storing data being written into a non-volatile memory cell array in a write buffer and writing data such that each data will have reached a stable storage state in the non-volatile memory prior to being over-written in the write buffer.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein:

FIG. 2 illustrates a layout of the cell array in FIG. 1 according to one embodiment.

FIG. 4 illustrates an example of the write address buffer in FIG. 1.

FIGS. 6A and 6B each illustrate a flowchart of the read operation according to an embodiment.

FIG. 16 illustrates of flowchart of a write operation according to another embodiment.

DETAILED DESCRIPTION OF EMBODIMENTS

Figure 1:
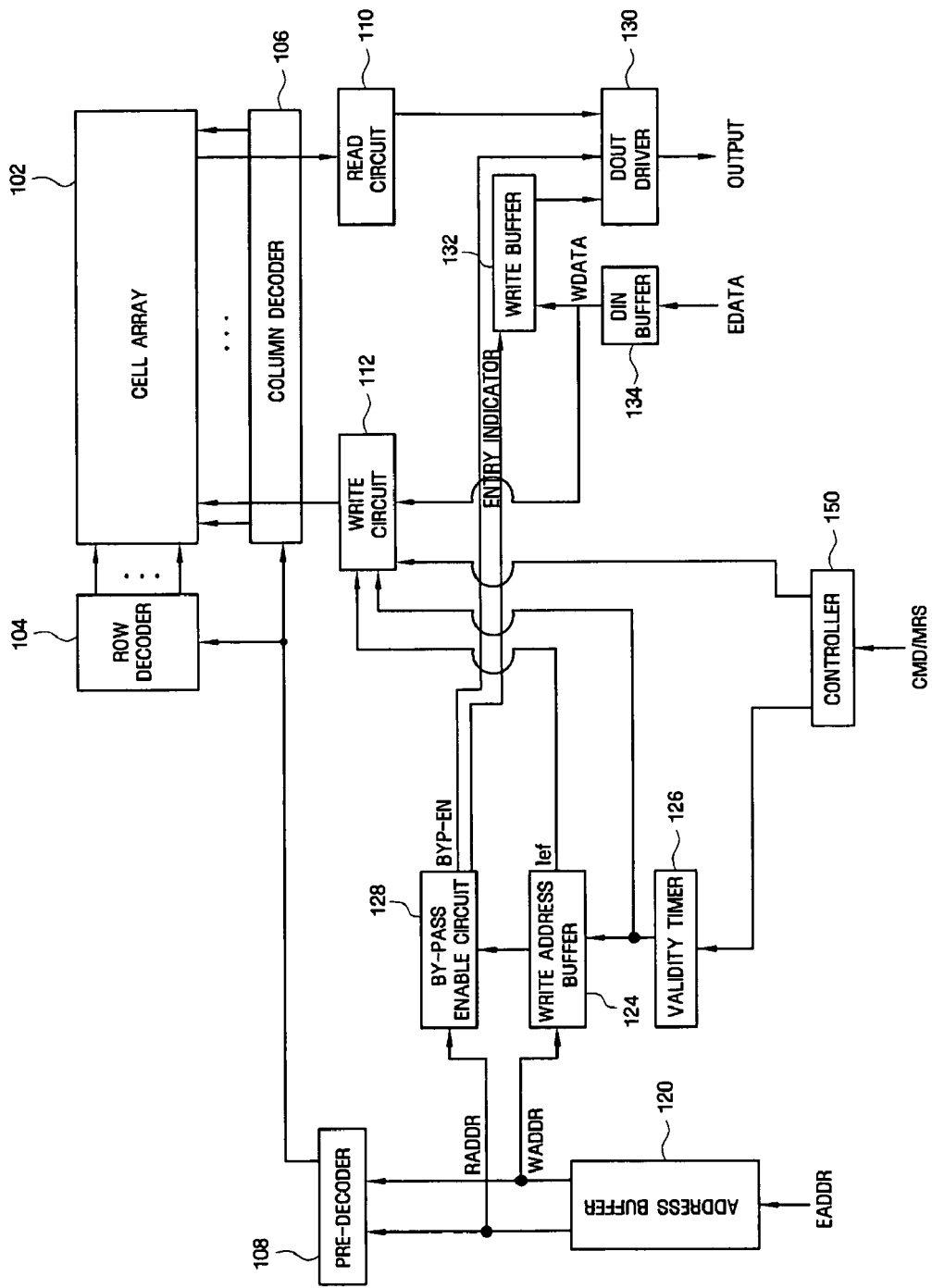
FIG. 1 illustrates a semiconductor device according to an embodiment.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

There are numerous types of non-volatile memories. A newer type of non-volatile memory is a resistive material based memory array. For example, a resistance based memory array may be a PRAM (phase change material RAM), RRAM (resistive RAM), MRAM (magnetic RAM), etc. MRAMs use spin torque transfer phenomenon (STT). Spin torque transfer writing technology is a technology in which data is written by aligning the spin direction of the electrons flowing through a TMR (tunneling magneto-resistance) element. Data writing is performed by using a spin-polarized current with the electrons having the same spin direction. U.S. Pat. No. 6,545,906 discloses an example MRAM, and is incorporated herein by reference in its entirety.

RRAM or ReRAM takes advantage of controllable resistance changes in thin films of various resistance materials. For example, a dielectric, which is normally insulating, can be made to conduct through a filament or conduction path formed after application of a sufficiently high voltage. The conduction path formation can arise from different mechanisms, including defects, metal migration, etc. Once the filament is formed, the filament may be reset (broken, resulting in high resistance) or set (re-formed, resulting in lower resistance) by an appropriately applied voltage. During application of the appropriate voltage, resistance varies until the high resistance or low resistance state is achieved. U.S. Pat. Nos. 6,849,891 and 7,282,759 disclose example RRAMs, and are both incorporated herein by reference in their entirety.

PRAMs rely on the application of heat to phase change resistor cells to change the resistive state of the phase change resistor cells. Normally, a current is supplied to the phase change resistor cell to apply the heat. The amount and duration of the current establishes whether the phase change resistor cell achieves a low resistance state or achieves a high resistance state. The low resistive state is called a set state and may represent, for example, a logic zero state. The high resistive state is called a reset state, and may represent, for example, a logic high state. GST or a chalcogenide alloy is a common phase change material used in the phase change resistor cells.

After application of heat to effect a state change, an amount of time must pass before the phase change material stabilizes in the set or reset states. Accordingly reading from a cell prior to the cell settling in the set or reset state may result in incorrect reading of data from the memory cell array.

Figure 3:
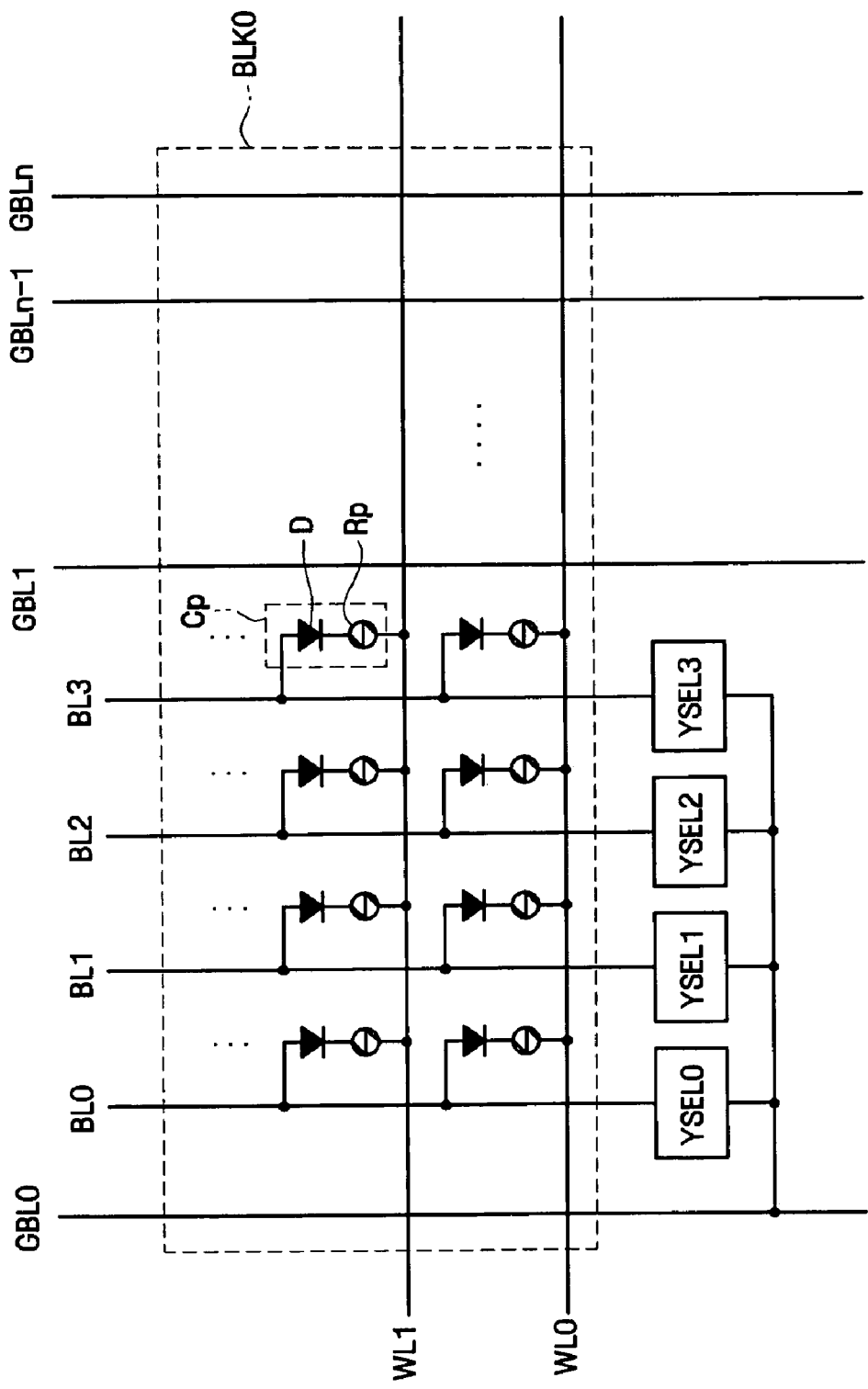
FIG. 3 illustrates a portion of memory block BLK0 in FIG. 2.

FIG. 1 illustrates a semiconductor device according to an embodiment. As shown, the semiconductor device includes a non-volatile memory cell array 102. In one embodiment, the non-volatile memory cell array 102 is a resistive material based memory cell array. For the purposes of example only, the memory cell array 102 will be described as being a phase change memory cell array (PRAM); however, it will be understood that the memory cell array 102 may be any resistive material based memory array such as PRAM, RRAM, MRAM, etc. FIG. 2 illustrates a layout of the cell array 102 according to one embodiment. As shown, the memory cells in the array are divided into memory banks 10, and each memory bank 10 is divided into memory blocks BLKi. FIG. 3 illustrates a portion of memory block BLK0. It will be appreciated that the other memory blocks may be structured in the same manner. As shown, PRAM cells Cp are located at the intersections of word lines Wi (e.g., W1 and W2) and bit lines BLi (e.g., BL0, BL1, BL2, and BL3). Each PRAM cell Cp includes a current control device D and a phase change resistor cell Rp connected in series between a respective bit line BLi and a word line Wi. As shown, each current control device D is a diode, but may instead be a transistor. Furthermore, each phase change resistor cell Rp may be formed of phase change material disposed between two electrodes. The phase change material may be GeSbTe (GST), GaSb, InSb, InSe, Sb2Te3, GeTe, GeSbTe, GaSeTe, InSbTe, SnSb2Te4, InSbGe, AgInSbTe, (GeSn)SbTe, GeSb(SeTe), Te81Ge15Sb2S2, etc.

A column selector YSELi selectively connects each respective bit line BLi to a global bit line GBL0. This structure is repeated for several global bit lines GBLi. Furthermore, while only two word lines are shown, it will be appreciated that a single block BLKi may include more than two word lines, with the commensurate increase in PRAM cells Cp. Similarly, instead of four bit lines BLi being associated with each global bit line GBLi, more or less than four bit lines BLi may be associated with each global bit line GBLi.

Returning to FIG. 1, an external address EADDR is received and buffered by an address buffer 120 in association with a command CMD received by a controller 150. The controller 150 decodes the command CMD into a write command, read command, etc. The controller 150 sends the read or write command to the address buffer 120. For write commands, the address buffer 120 stores and outputs the external address EADDR as a write address WADDR. For read commands, the address buffer 120 stores and outputs the external address EDDR as a read address RADDR.

A pre-decoder 108 pre-decodes the received read or write address into row and column addresses. A row decoder 104 further decodes the row address and selectively drives the word lines WLi in the memory cell array 102. A column decoder 106 further decodes the column address and selectively controls the column selectors YSELi to connect bit lines BLi to global bit lines GBLi.

Figure 5:
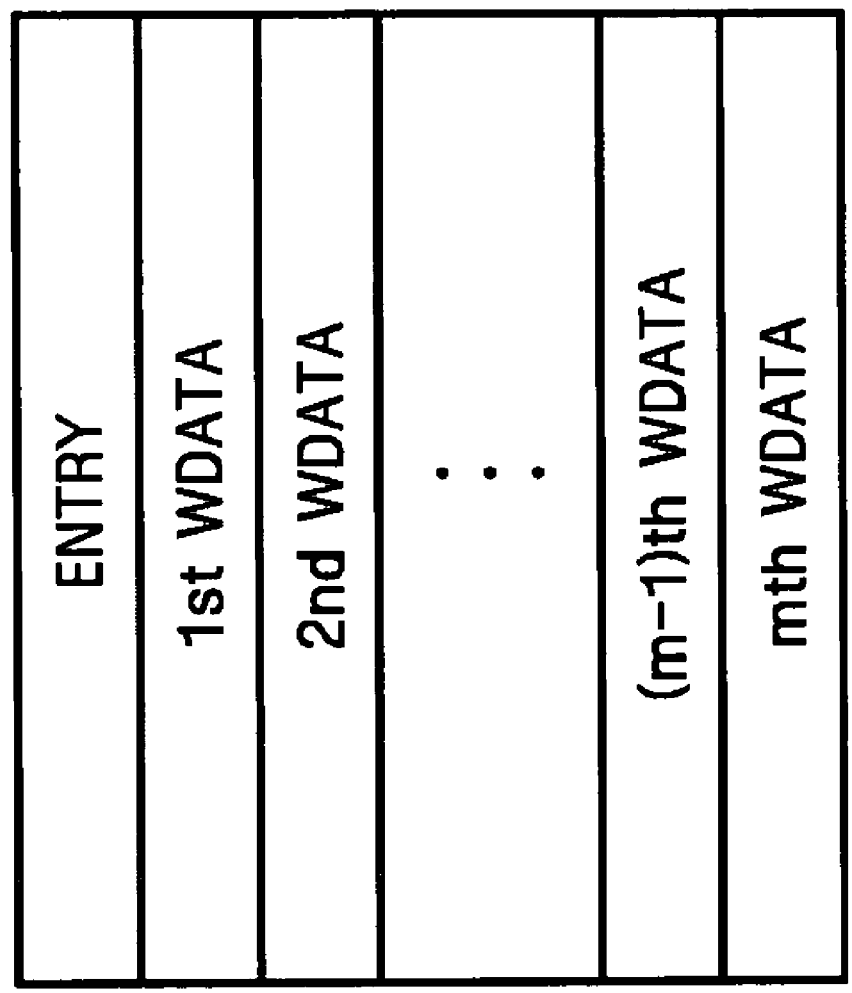
FIG. 5 illustrates an example of the write buffer in FIG. 1.

During a write operation, the write addresses output from the address buffer 120 are stored by a write address buffer 124. In conjunction, externally supplied data EDATA is buffered by a data input buffer 134 and stored as write data WDATA in a write buffer 132. FIG. 4 illustrates an example of the write address buffer 124. As shown, each write address is stored in an entry of the write address buffer 124, and each entry has an associated validity flag. When the write address buffer 124 stores a write address in an entry, the write address buffer 124 sets the validity flag associated with the entry to "1". This indicates the entry is valid. FIG. 5 illustrates an example of the write buffer 132. As shown, each write data WDATA is stored in an entry of the write buffer 132. Each entry may store a single data word, two data words, etc. as write data WDATA depending on the design of the semiconductor device. The write buffer 132 includes a same number of entries as the write address buffer 124, and write data WDATA and the corresponding write address WADDR are stored in corresponding entries in the write buffer 132 and write address buffer 124, respectively. Entries in the write address buffer 124 and the write buffer 132 are filled consecutively 1 to m, and then overwritten consecutively 1 to m. The validity flag for an entry in the write address buffer 124 also indicates the validity of write data WDATA in the corresponding entry of the write buffer 132.

A validity timer 126 measures a set period of time referred to as the validity time period. Measuring or counting down this time period restarts (or resets) with each receipt of a write command from the controller 150. Accordingly, consecutively received write commands cause successive resetting of the validity time period such that the validity time period expires after the set period of time from the last received write command. The validity timer 126 informs the write address buffer 124 of the validity time period or at least expiration of the validity time period via a validity timing signal VT. In response to expiration of the validity time period, the write address buffer 124 sets the validity flags for each entry to "0," which indicates the entries are not valid. In one embodiment, the validity time period is set equal to or longer than a period of time for data written into the memory cell array 102 to settle or stabilize. For example, the validity time period may be set longer than the expected settling time by a desired margin to account for manufacturing variations. The validity time period may be programmable by applying a command or mode register set such that, in response, the controller 150 programs a received, desired validity time in the validity timer 126. The validity time period may also be set in other ways such as through fuses, etc. Instead of the controller 150 receiving and programming the validity timer 126, the validity timer 126 may directly receive a mode register set to program the validity time period.

In addition to the write buffer 132, the data to be written WDATA in the memory cell array 102 is also supplied to the write circuit 112. The write circuit 112 writes the write data WDATA in the memory cell array 102 by supplying the appropriate currents and/or voltages to set or reset the memory cells consistent with the logic states of the write data WDATA. As discussed above, the memory cells being written are selected by the row and column decoders 104 and 106. The write circuit 112 and write operation will be described in greater detail below following a description of the read operation.

During a read operation, the read address RADDR supplied to the pre-decoder 108 by the address buffer 120 is also supplied to a by-pass enable circuit 128. The by-pass enable circuit 128 compares the read address RADDR to the valid write addresses WADDRs stored in the write address buffer 124. If a match is found, the by-pass enable circuit 128 enables a by-pass enable signal BYP_EN, otherwise, the by-pass enable signal BYP_EN is not enabled. The by-pass enable circuit 128 also sends an entry indicator indicating the entry having the matching address to the write buffer 132.

Also during the read operation, the read circuit 110 reads the data from the addressed memory cell or cells, and outputs the read data to a data output driver 130. The data output driver 130 receives the by-pass enable signal BYP_EN, and selectively outputs one of the read data from the read circuit 110 and data stored in the write buffer 132. In particular, the write buffer 132 supplies the write data WDATA in the entry indicated by the entry indicator to the data output driver 130. If the bypass enable signal BYP_EN is enabled, the write data WDATA from the write buffer 132 is output by the data output driver 130. However, if the by-pass enable signal BYP_EN is not enabled, then the write buffer 132 outputs the data read from the memory cell array 102.

Next, the read operation will be described with respect to the flow charts illustrated in FIGS. 6A and 6B, and the waveform diagram of FIG. 7.

FIG. 6A illustrates one embodiment of a read operation. As shown, in step S610 a read operation is executed. Namely, an external command CMD and address EADDR are received. The controller 150 decodes the external command into a read command and instructs the read circuit 110 to read data from the memory cell array 102. The address buffer 120 buffers the external address EDATA and outputs the address as a read address RADDR. The pre-decoder 108, row decoder 104 and column decoder 106 decode the read address, and drive the appropriate word lines and column selectors YSELi such that the read circuit 110 reads the requested data and outputs the requested data to the data output buffer 130.

During this process, the by-pass enable circuit 128 compares the read address RADDR to the valid write addresses stored in the write address buffer 124 in step S615. If a match is found, then the by-pass enable circuit 128 sets the by-pass enable signal BYP_EN and outputs an entry indicator signal indicating the entry of the matching address. In step S620, the data output buffer 130 outputs the write data WDATA stored in the entry of the write buffer 132 indicated by the entry indicator.

However, if in step S615 the read address RADDR does not match a valid write address WADDR stored in the write address buffer 124, then in step S625 the data output buffer 130 outputs the data read from the memory cell array 102 by the read circuit 110.

Figure 7:
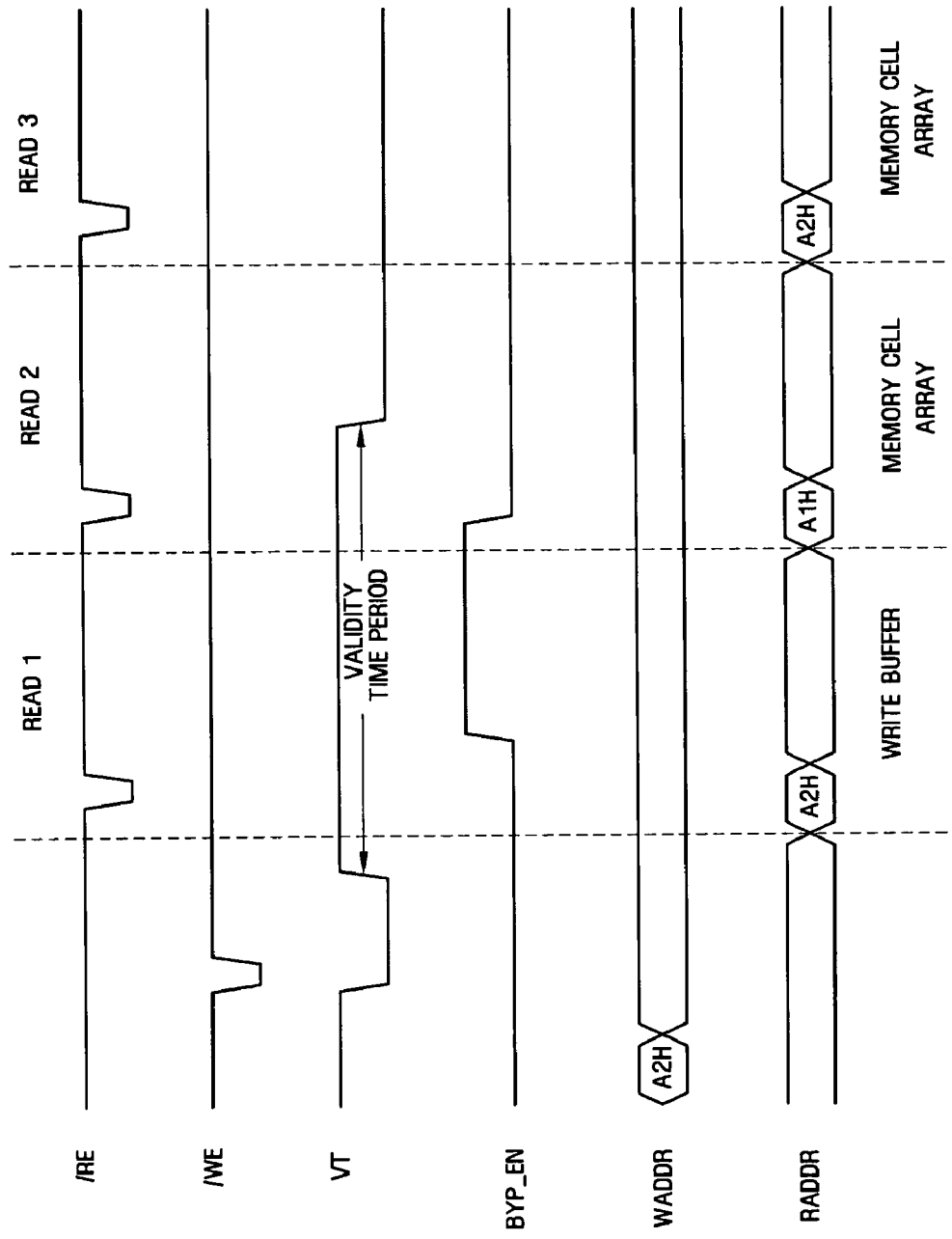
FIG. 7 illustrates example waveforms of signals generated during the read operation.

FIG. 7 illustrates examples of waveforms generated during the process of FIG. 6A. FIG. 7 shows assertion of a write enable signal /WE prior to three read operations Read1, Read2 and Read3. This represents receipt of a write command, and results in the resetting of the validity time period kept by the validity timer 126. FIG. 7 illustrates the validity signal VT generated by the validity timer 126.

For this write operation, FIG. 7 also shows receipt of a write address WADDR of "A2H". Accordingly, this write address will be stored in the write address buffer 124, and the validity flag for this write data will be set.

During the first read operation Read1, FIG. 7 shows assertion of a read enable signal /RE, which represents receipt of a read command. FIG. 7 also shows receipt of a read address RADDR of "A2H" during the first read operation. Because this read address matches a valid write address as evidenced by the validity signal VT in FIG. 7, the by-pass enable circuit 128 sets the by-pass enable signal BYP_EN as shown in FIG. 7. The by-pass enable circuit 128 also outputs (not shown) an entry indicator signal indicating the entry of the matching address. Therefore, for the first read operation Read1, the data output buffer 130 outputs the write data WDATA stored in the entry of the write buffer 132 indicated by the entry indicator.

For the second read operation Read2, even though the validity time period has not expired, the by-pass enable circuit 128 resets the by-pass enable signal BYP_EN because the read address RADDR of "A1H" received with read enable signal /RE of the second read operation Read2 does not match a write address WADDR stored in the write address buffer 132. Accordingly, the data output buffer 130 outputs data read from the memory cell array 102.

In the third read operation Read3, the read address RADDR is the same, "A2H", as the first read operation Read1. Accordingly, the read address RADDR matches a write address WADDR in the write address buffer 124. However, the write address in the write address buffer 124 is no longer valid. As shown in FIG. 7, the validity time period expired during the second read operation Read2, and in response, the write address buffer 124 will have invalidated the write address WADDRs stored therein. Accordingly, the by-pass enable circuit 128 does not enable the by-pass enable signal BYP_EN and the data output buffer 130 outputs data read from the memory cell array 102.

FIG. 7 demonstrates that step S615 in FIG. 6A may be performed as two separate steps as shown in FIG. 6B. As shown in FIG. 6B, the by-pass enable circuit 128 determines in step S617 whether the received read address RADDR matches a write address WADDR stored in the write address buffer 124. If a match does not exist, then step S625 is performed. However, if a match does exist, the by-pass enable circuit 128 then determines in step S619 if the validity time period has expired. If so, then step S625 is performed. However, if the validity time period has not expired, then step S620 is performed, and the data output buffer 130 outputs data from the write buffer 132.

As discussed above, data written into the memory cell array 102 takes some time to settle or stabilize. If data is read from the memory cell array 102 shortly or immediately after being written, the read value may be erroneous. Accordingly, in response to reading data shortly or immediately after being written, the requested data is output from the write buffer 132. This helps eliminate erroneous data read operations.

It will be appreciated that if the write buffer 132 and write address buffer 124 are sufficiently large, then written data will stabilize before the buffers are filled. However, many practical applications do not permit buffers of this size. Instead, write data that has not yet stabilized in the memory cell array 102 may be overwritten in the write buffer 132.

To this end, this semiconductor memory device may further provide for controlling the write operation based on buffer status and settling status of the write data. As shown in FIG. 1, the write circuit 112 receives a last entry filled flag lef from the write address buffer 124 and a validity timing signal VT from the validity timer 126. The write address buffer 124 sets the last entry filled flag lef if the last entry of the write address buffer 124 is filled with a valid address and the other entries in the write address buffer 124 are also filled with a valid address. Otherwise, the last entry filled flag is in an unset state.

If the write circuit 112 receives a set last entry filled flag lef, the write circuit 112 extends the time to write the write data WDATA associated with the last entry. The extension of the write period is based on the validity timing signal VT received from the validity timer 126. Namely, while the last entry flag is set, the write circuit 112 extends the write cycle period until expiration of the validity time period.

Figure 8:
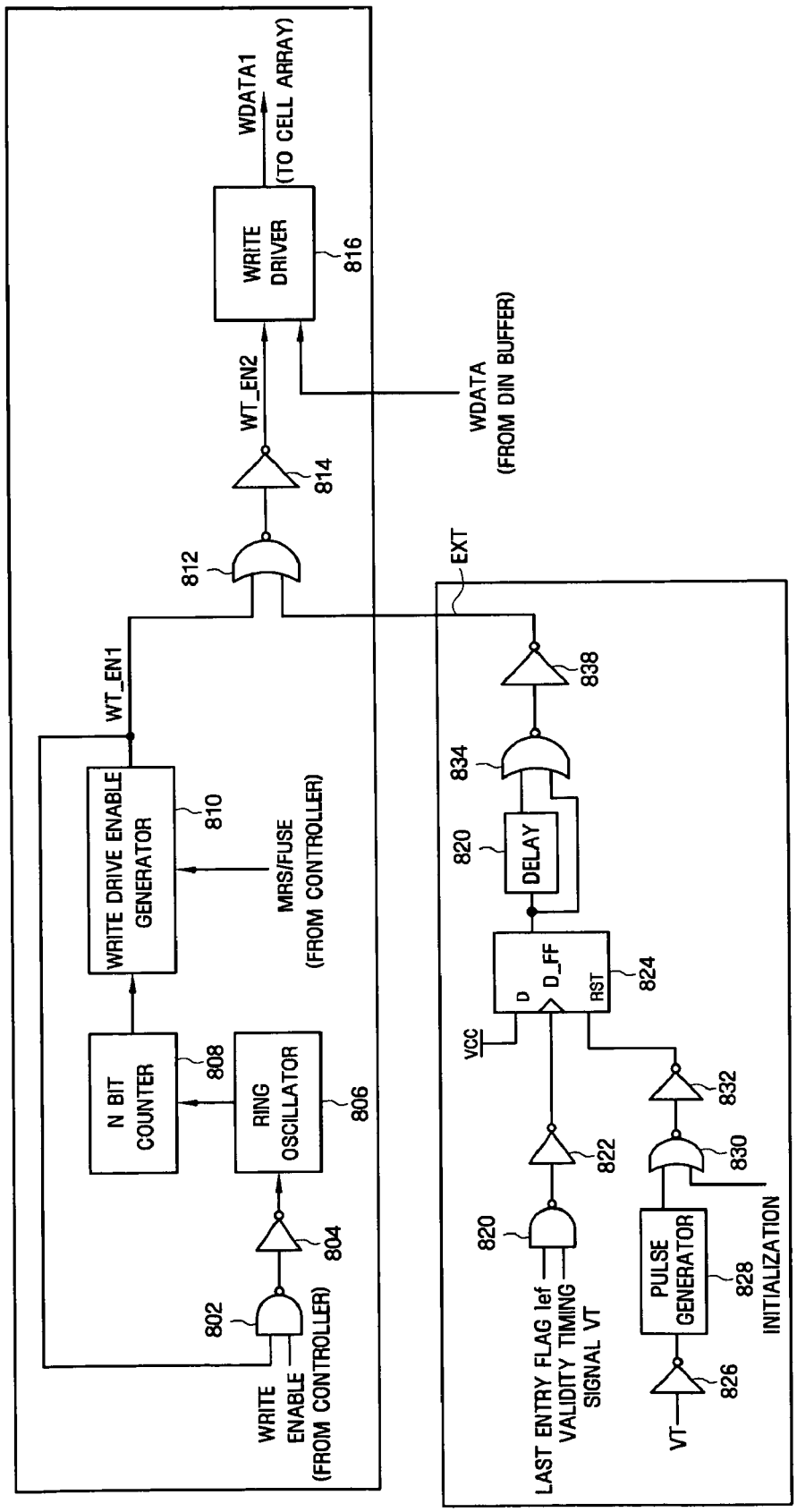
FIG. 8 illustrates an example embodiment of a write circuit.

FIG. 8 illustrates an embodiment of the write circuit in FIG. 1. As shown, the write circuit 112 includes a NAND gate 802 that receives a write enable signal from the controller 150 and a first write driver enable signal WT_EN1 from a write driver enable generator 810. The controller 150 generates a logic "1" (or logic high level) write enable signal in response to receipt of a write command. The write driver enable generator 810 is described below.

An inverter 804 inverts output from the NAND gate 802. A ring oscillator 806 is triggered when a logic "1" write enable signal is received by the NAND gate 802. An N-bit counter 808 generates a count based on the output of the ring oscillator 808. The write driver enable generator 810 generates the first write driver enable signal WT_EN1 such that the first write driver enable signal WT_EN1 will be a logic high value (e.g., logic "1") until the counter 808 reaches a set count value. Stated another way, the write driver enable generator 810 generates the first write driver enable signal WT_EN1 such that the first write driver enable signal WT_EN1 will be a logic high value (e.g., logic "1") for a set period of time referred to as an enable period. As shown, the controller 150 may program the set count value or enable period in the write drive enable generator 810. This time period may also be set in other ways such as through fuses, etc. Instead of the controller 150 receiving and programming the enable period, the first write driver enable generator 810 may directly receive a code (e.g., mode register set) to program the enable period.

A NOR gate 812 NORs the first write driver enable signal WT_EN1 and an extension signal EXT. Generation of the extension signal EXT will be described in greater detail below. An inverter 814 inverts the output of the NOR gate 812 to generate a second write driver enable signal WT_EN2. Accordingly, the second write driver enable signal WT_EN2 will be logic high if either of the first write driver enable signal WT_EN1 or the extension signal EXT are logic high.

Next, generation of the extension signal EXT will be described. As shown, a NAND gate 820 NANDs the last entry flag lef with the validity timing signal VT, and an inverter 822 inverts the output of the NAND gate 820. The output of the inverter 822 serves as the input to a D-type flip-flop 824. Accordingly, only if both the last entry flag lef and the validity time signal VT are logic high (e.g., logic "1") does the D-type flip-flop store a logic "1"; otherwise, a logic "0" is stored.

Furthermore, an inverter 826 inverts the validity timing signal VT for input to a pulse generator 828. The pulse generator 828 generates a logic high signal in response to receipt of a logic low input. Namely the pulse generator 828 generates a logic high signal when the validity timing signal VT is logic high, and generates a logic low signal when the validity timing signal VT is logic low. A NAND gate 830 NANDs the output from the pulse generator 828 and an initialization signal. An inverter 832 inverts the output of the NAND gate 830 and supplies the resulting output to the reset input of the D-type flip-flop 824. If either the output of the pulse generator 828 or the initialization signal is logic low, the D-type flip-flop 824 is reset to store a logic zero. Accordingly, a logic low initialization signal is supplied to initialize the D-type flip-flop 824 to store a zero. And, stated another way, the D-type flip-flop 824 is only not reset if both the validity timing signal VT and the initialization signal are logic high.

A delay 834 delays output of the D-type flip-flop 824, and a NAND gate 836 NANDs the output of the D-type flip-flop 824 and the output of the delay 834. The delay 834 delays outputting the output from the D-type flip-flop 824 for a period of time. An inverter 838 inverts the output of the NAND gate 836 to generate the extension signal EXT. Accordingly, after the D-type flip-flop 824 outputs a logic high signal for the period of time set in the delay 834 does the extension signal EXT become logic high. Stated another way, the extension signal EXT becomes logic high only if (1) the last entry flag lef is logic high, (2) the validity timing signal VT is logic high, and (3) the initialization signal is logic high (no initialization). And, the extension signal becomes logic high a period of time set in the delay 834 after conditions (1)-(3) exist.

As discussed above, the second write driver enable signal WT_EN2 is logic high if either the first write driver enable signal WT_EN1 or the validity timing signal VT are logic high. A logic high second write driver enable signal WT_EN2 enables a write driver 816 to apply appropriate voltages and/or currents to the memory cell array 102 to write the write data WDATA output from the data input buffer 134. The length of the write cycle to write the write data WDATA is governed by the length of time the second write driver enable signal WT_EN2 is logic high. As should be appreciated from this description, a logic low second write driver enable signal WT_EN2 disables the write driver 816.

Figure 9:
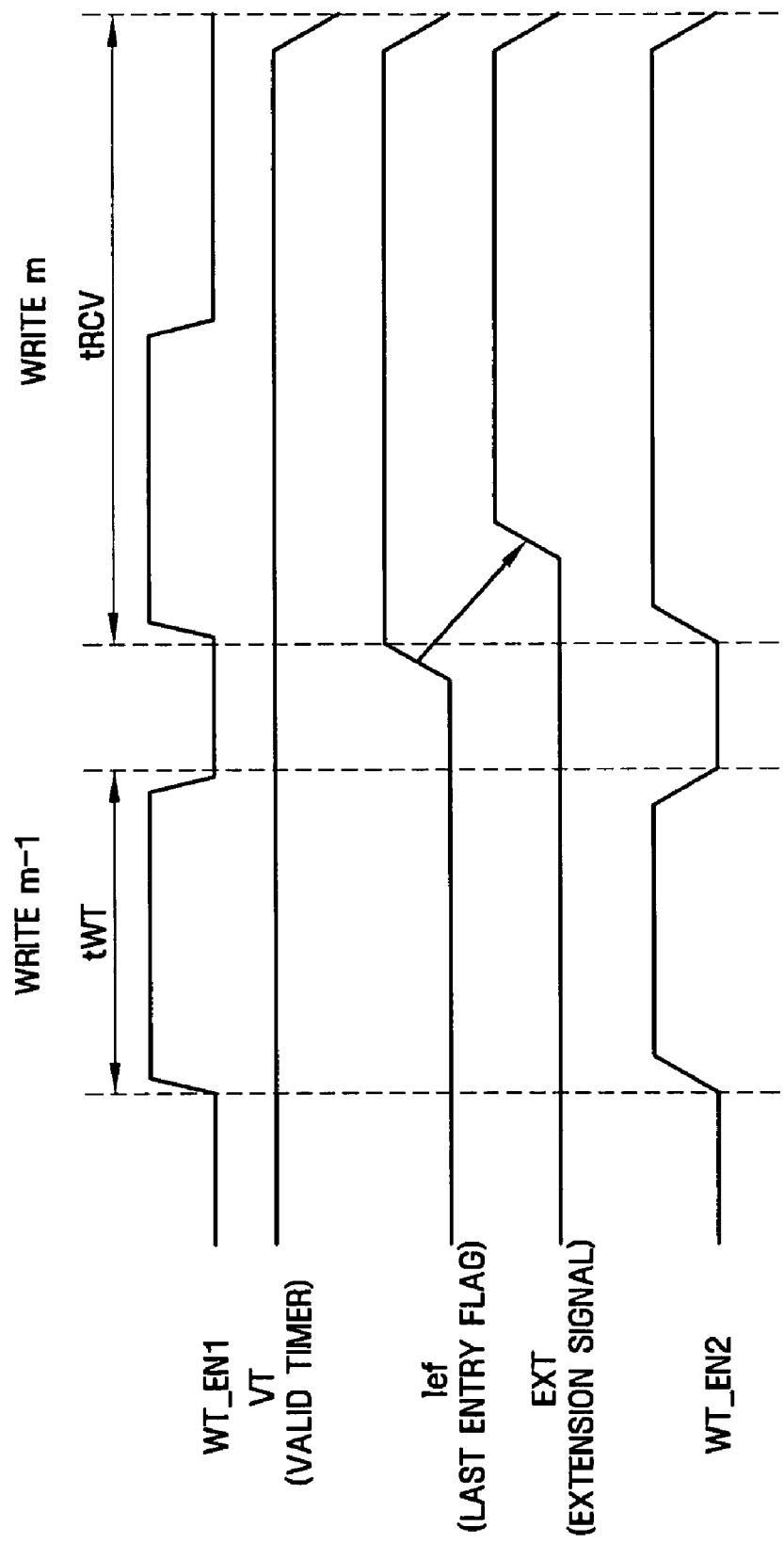
FIG. 9 illustrates example waveforms of signals generated during the write operation with respect to the write circuit of FIG. 8.

FIG. 9 illustrates a waveform diagram of a portion of the signals generated during two example write operations. As shown, during an (m−1)th write operation in which, for example, the (m−1)th write data WDATA in the write buffer 132 is written, the write driver enable generator 810 generates the first write driver enable signal WT_EN1. Namely, the write enable signal for the (m−1)th write operation from the controller 150 triggers the write driver enable generator 810 to generate the first write driver enable signal WT_EN1. As shown in FIG. 9, the write driver enable generator 810 generates the first write driver enable signal WT_EN1 for a first enable period of tWT. As will be recalled, the first enable period tWT is programmed in the write driver enable generator 810. For example, operation speed of a memory if often a concern. Accordingly, the first enable period tWT may be the shortest possible time to permit reliable writing of data in the memory cell array 102.

As shown in FIG. 9, since the (m−1)th entry is not the last entry, the last entry flag lef is logic low. Therefore, the extension signal EXT is logic low. Because the extension signal EXT is logic low, the extension signal EXT does not affect generation of the second write driver enable signal WT_EN2. As a result, the inverter 814 essentially outputs the first write driver enable signal WT_EN1 as the second write driver enable signal WT_EN2. Namely, the second write driver enable signal WT_EN2 will be logic high for the first enable period tWT. Accordingly, the write driver 816 writes the write data WDATA from the data input buffer 134 over the first enable period tWT.

FIG. 9 also shows an example of the mth write operation for writing data stored in the last or mth entry of the write buffer 132. Here, the first write driver enable signal WT_EN1 is generated in the same manner as the (m−1)th write operation. However, because the last or mth entry of the write address buffer 124 has been filled and the entries in the write address buffer 124 are valid, the last entry flag lef becomes logic high. With both the validity timing signal and the last entry flag lef logic high, the extension signal EXT becomes logic high a period time (based on delay 834) after these conditions exist.

The extension signal EXT remains high until the validity timing signal goes low to indicate that the entries in the write address buffer 124 are no longer valid. As shown, in FIG. 9, even though the first write driver enable signal WT_EN1 goes logic low (i.e., the first enable period expires), the second write driver enable signal WT_EN2 remains logic high until the validity timing signal VT goes logic low (i.e., until the validity time period expires). Accordingly, the write driver 816 writes the write data WDATA corresponding to the last write address entry or last write buffer entry for a write cycle that is extended until expiration of the validity time period. This period of time is referred to as the recover time period tRCV because the data written in the memory cell array 102 is expected to have stabilized and recovered from the write operation.

Next, the write operation will be described with respect to the flow chart illustrated in FIG. 10 and the waveform diagram of FIG. 11.

Figure 10:
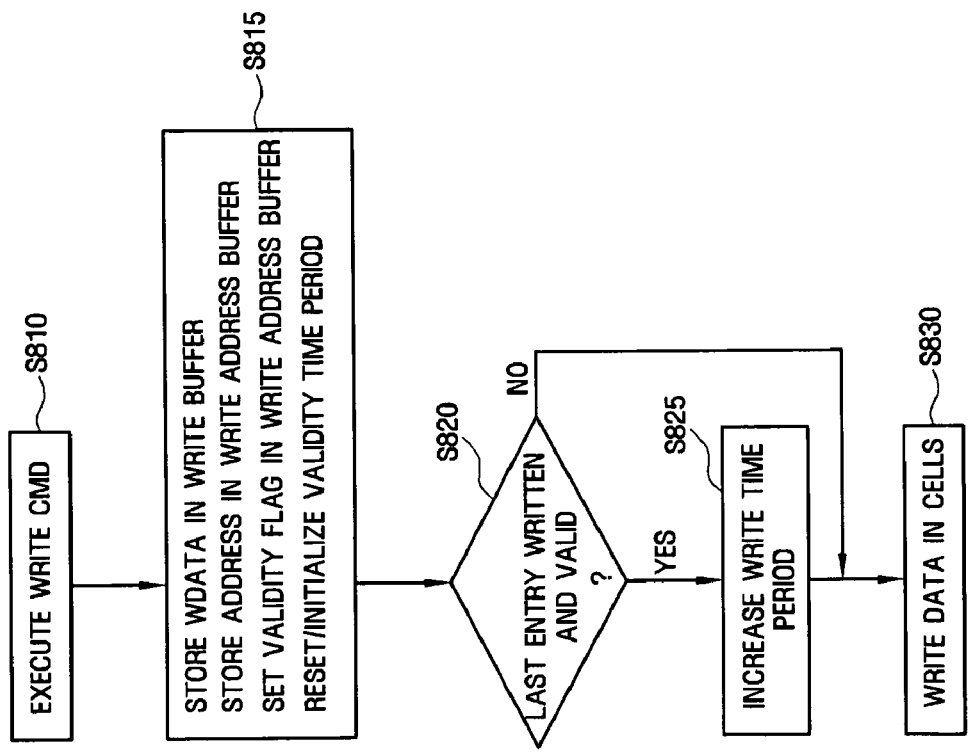
FIG. 10 illustrates of flowchart of the write operation according to an embodiment.

FIG. 10 illustrates one embodiment of a write operation. As shown, in step S810 a write operation is executed. Namely, an external command CMD, address EADDR, and data EDATA are received. The controller 150 decodes the external command into a write command and sends the write enable signal to the write circuit 112 to write data into the memory cell array 102. The data input buffer 134 buffers the external data EDATA and outputs the data as write data WDATA to the write circuit 112. The address buffer 120 buffers the external address EDATA and outputs the address as a write address WADDR. The pre-decoder 108, row decoder 104 and column decoder 106 decode the write address, and drive the appropriate word lines and column selectors YSELi such that the write circuit 110 writes the write data WDATA in the memory cell array 102.

During this process, in step S815, the write buffer 132 stores the write data WDATA output from the data input buffer 134, the write address buffer 124 stores the write address WADDR output by the address buffer 120, the write address buffer 124 sets the validity flag for this write address WADDR, and the validity timer 126 resets or initializes the validity time period.

During step S820, the write address buffer 124 monitors whether an address has been written in the last entry of the write address buffer 124 and whether that last entry is valid. If so, then in step S825, the write address buffer 124 sets a last entry flag lef, and in response, the write circuit 112 lengthens the write cycle or period for writing the write data WDATA. In particular, the write circuit 112 lengthens the write period until the validity time period expires. The write circuit 112 writes the write data in the memory cell array 102 in step S830.

If in steps S820, an address has not been written in the last entry or the last entary is not valid, then in step S830 the write circuit 112 writes the write data WDATA in the memory cell array 102 without a lengthened write cycle.

Figure 11:
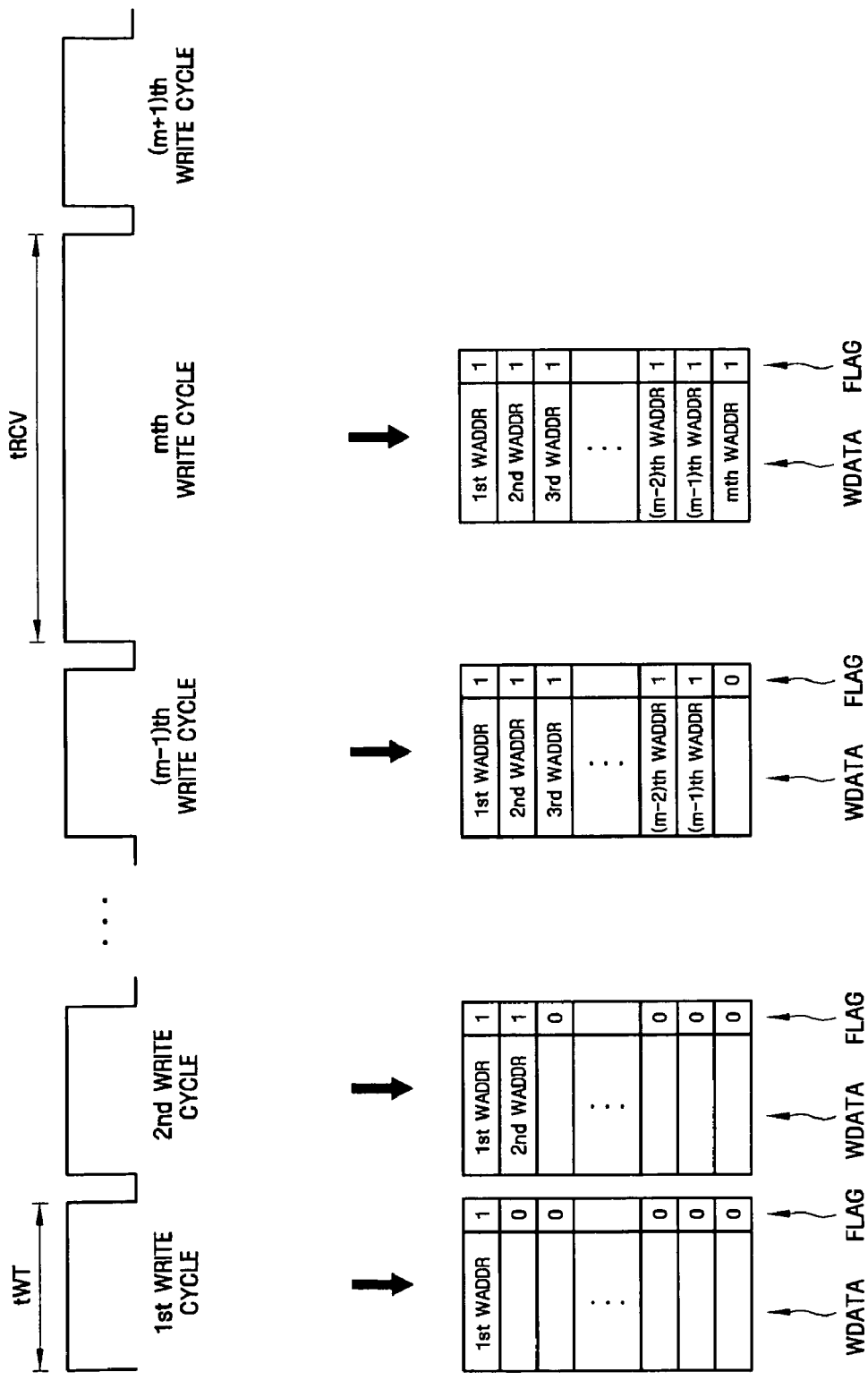
FIG. 11 illustrates example waveforms of signals generated during the write operation.
Figure 12:
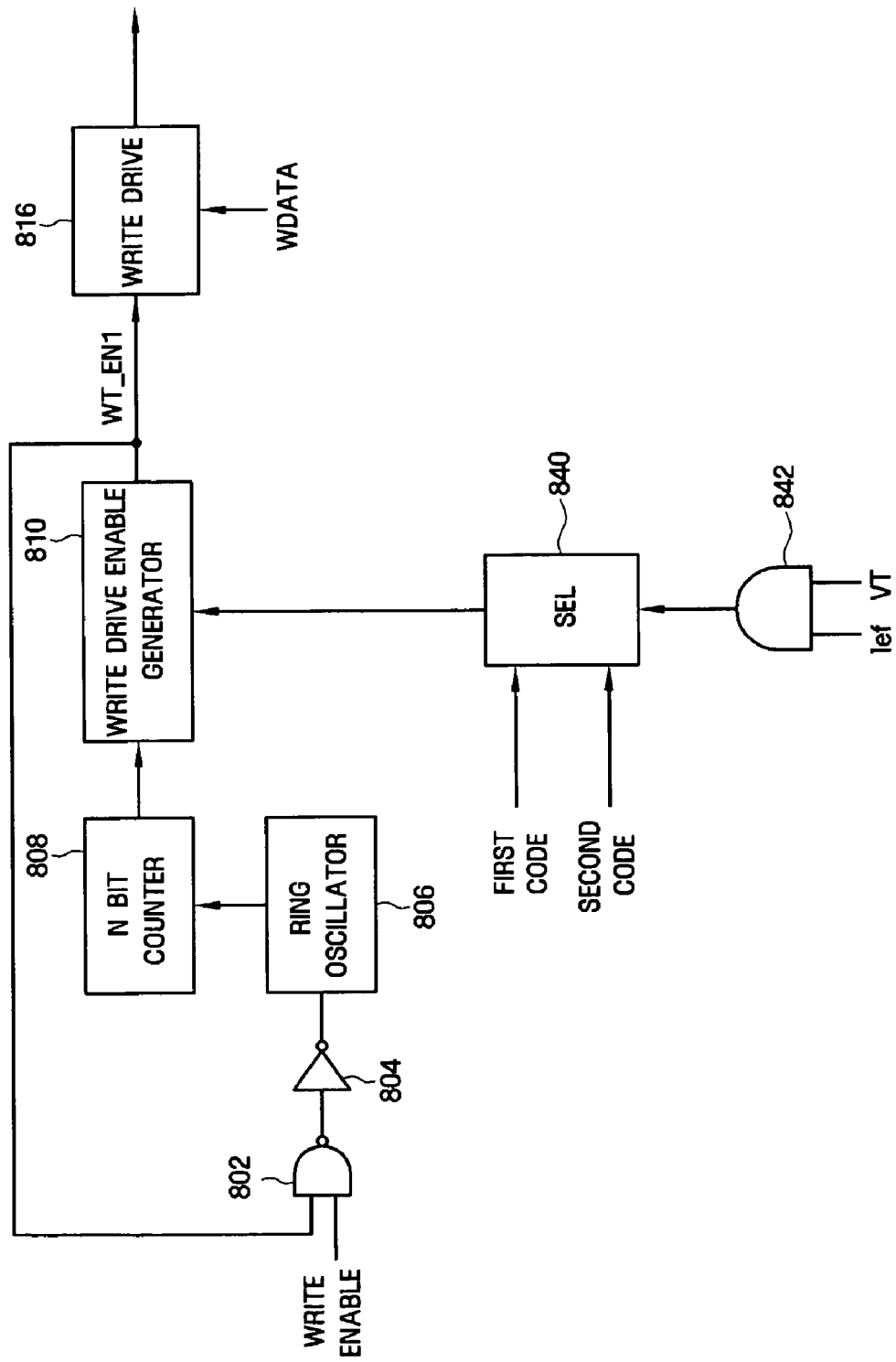
FIG. 12 illustrates another embodiment of the write circuit in FIG. 1.

FIG. 11 illustrates example write cycle times and example write buffer status for a plurality of write operations. As shown in this example, each of the first through (m−1)th write operations results in a write address WADDR being stored in the address buffer 124 and the validity flag for that write address being set. Also, the write circuit 112 writes the write data WDATA associated with each of these write addresses, and the write cycle is of a normal length of time tWT. However, if the last entry of the write buffer 124 is filled and the last entry is valid as shown in FIG. 12, then the write buffer 124 sets the last entry flag lef. In response, the write circuit 112 lengthens the write period until expiration of the validity time period. As such, the total length of this write cycle is at least a recovery period of time tRCV for the write data to stabilize in the memory cell array 102.

This ensures that the mth write data and the previous write data have settled in the memory cell array 102 before any data is overwritten in the write buffer 132. This helps prevent erroneous read after write operations because a subsequent write or read operation can not take place until this mth write cycle completes.

From the above discussion, it will be appreciated that in this and the following embodiments the write circuit 112, the write address buffer 124, and/or the validity timer 126 may form a write unit. In this and the following embodiments, the write unit is configured to write data in the memory cell array 102 such that each data reaches a stable storage state prior to being over-written in the write buffer 132. In particular, in this embodiment, the write unit is configured to selectively increase a time to write data in the memory cell array 102 that fills a last entry in the write buffer 132 as compared to the time to write data in the memory cell array 102 that fill other locations of the write buffer 132.

FIG. 12 illustrates another embodiment of the write circuit 112. As shown, the write circuit 112 includes a NAND gate 802 that receives a write enable signal from the controller 150 and a first write driver enable signal WT_EN1 from a write driver enable generator 810. The controller 150 generates a logic "1" (or logic high level) write enable signal in response to receipt of a write command. The write driver enable generator 810 is described below.

An inverter 804 inverts output from the NAND gate 802. A ring oscillator 806 is triggered when a logic "1" write enable signal is received by the NAND gate 802. An N-bit counter 808 generates a count based on the output of the ring oscillator 808. The write driver enable generator 810 generates the first write driver enable signal WT_EN1 such that the first write driver enable signal WT_EN1 will be a logic high value (e.g., logic "1") until the counter 808 reaches a set count value. Stated another way, the write driver enable generator 810 generates the first write driver enable signal WT_EN1 such that the first write driver enable signal WT_EN1 will be a logic high value (e.g., logic "1") for a set period of time referred to as an enable period. A selector 840 supplies either a first code or a second code to the write driver enable generator 810 to program the enable period. If the selector 840 supplies the first code to the write driver enable generator 810, the first write driver enable signal WT_EN1 is logic high for the first enable period tWT. However, if the selector 840 supplies the second code to the write driver enable generator 810, the first write driver enable signal WT_EN1 is logic high for a second enable period. The second enable period may be equal to or greater than a period of time for data written in the memory cell array 102 to stabilize or settle. For example, in one embodiment, the second enable period may be set equal to the validity time period.

As shown in FIG. 12, an AND gate 842 supplies the control signal to control the selection made by the selector 840. The AND gate ANDs the validity timing signal VT and the last entry flag lef. Accordingly, the AND gate 842 only generates a logic high value if both the validity timing signal VT and the last entry flag lef are logic high. In response to a logic high output from the AND gate 842, the selector 840 supplies the second code. If the output from the AND gate 842 is logic low, the selector 840 supplies the first code.

In this embodiment, the first write driver enable signal WT_EN1 is supplied to the write driver 816, and the write driver 816 is enabled to apply appropriate voltages and/or currents to the memory cell array 102 to write the write data WDATA output from the data input buffer 134 if the first write driver enable signal WT_EN1 is logic high. The length of the write cycle to write the write data WDATA is governed by the length of time the first write driver enable signal WT_EN1 is logic high. As should be appreciated from this description, a logic low first write driver enable signal WT_EN1 disables the write driver 816.

The embodiment of the write driver 112 shown in FIG. 12 produces the same results as the embodiment of the write driver 112 in FIG. 8. As such, the flow chart of FIG. 10 and the write cycle illustration of FIG. 11 equally apply to the embodiment of FIG. 12. And, FIG. 12 results in the same advantages discussed above.

Figure 13:
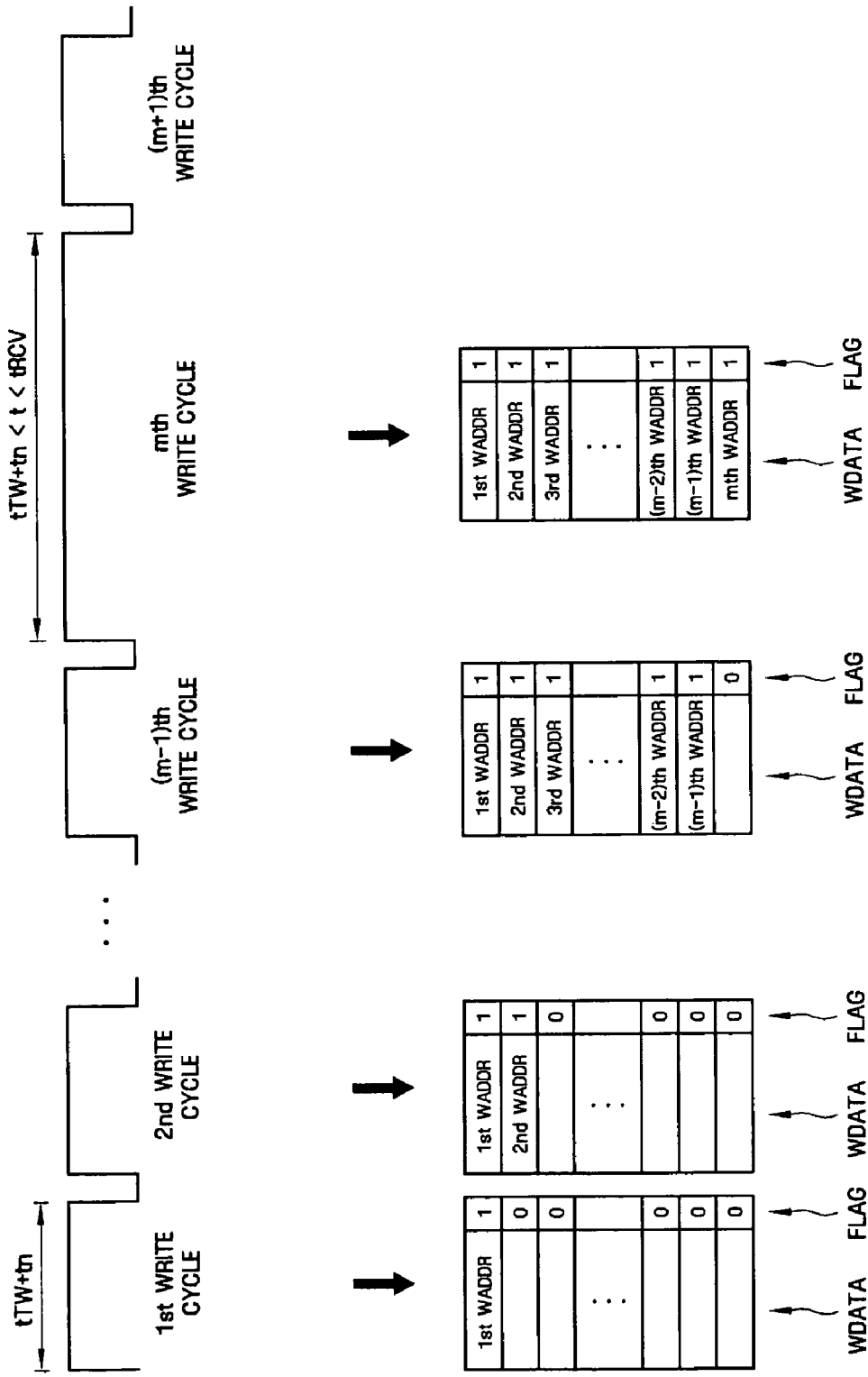
FIG. 13 illustrates example waveforms of signals generated during the write operation according to another embodiment.

In another embodiment, with respect to the write circuit of FIG. 12, the first code may be set such that the first code causes the write cycle to last for a period of time greater than the normal write cycle tTW. Complementary to this, the second code may be set such that the second code cause the write cycle to last less than a period of time for data written in the memory cell array 102 to stabilize; namely, set less than tRCV. FIG. 13 illustrates example write cycle times and example write buffer status for a plurality of write operations in this embodiment. As shown in this example, each of the first through (m−1)th write operations results in a write address WADDR being stored in the address buffer 124 and the validity flag for that write address being set. Also, the write circuit 112 writes the write data WDATA associated with each of these write addresses, and the write cycle is greater than a normal length of time tWT, but less than the recovery time period tRCV. Namely, the write cycle time is a period tWT+tn. However, if the last entry of the write buffer 124 is filled and the last entry is valid as shown in FIG. 13, then the write buffer 124 sets the last entry flag lef. In response, the write circuit 112 lengthens the write period by a time greater then the first extended period of tWT+tn, but less than the recovery period of time tRCV. In this embodiment, because the first through (m−1)th write cycle times are lengthened beyond the normal write cycle time of tWT, the last or mth write cycle may be less than the recovery time period tRCV and still ensure that the mth write data and the previous write data have settled in the memory cell array 102 before being overwritten in the write buffer 132.

Figure 14:
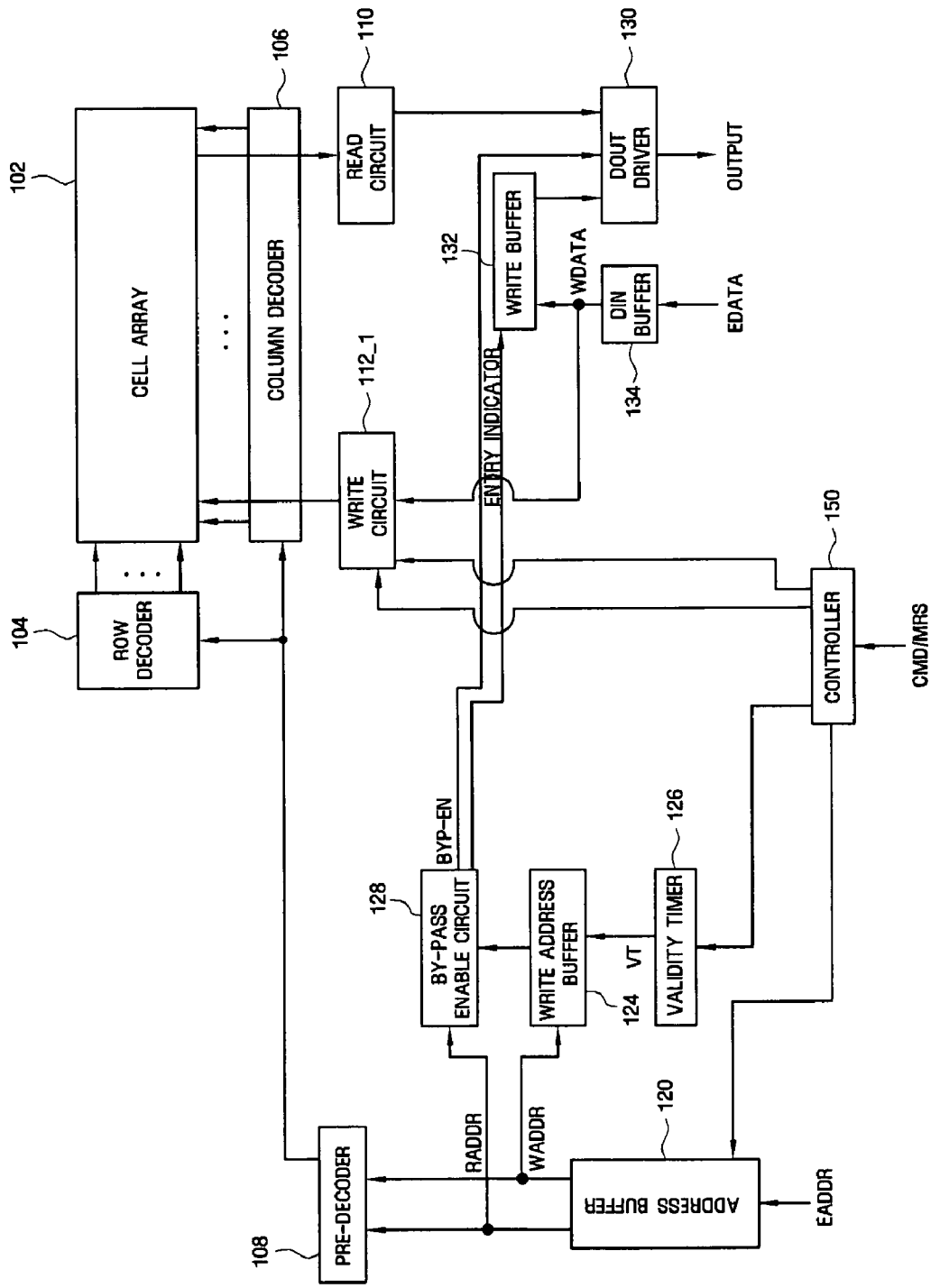
FIG. 14 illustrates a semiconductor device according to another embodiment.
Figure 15A:
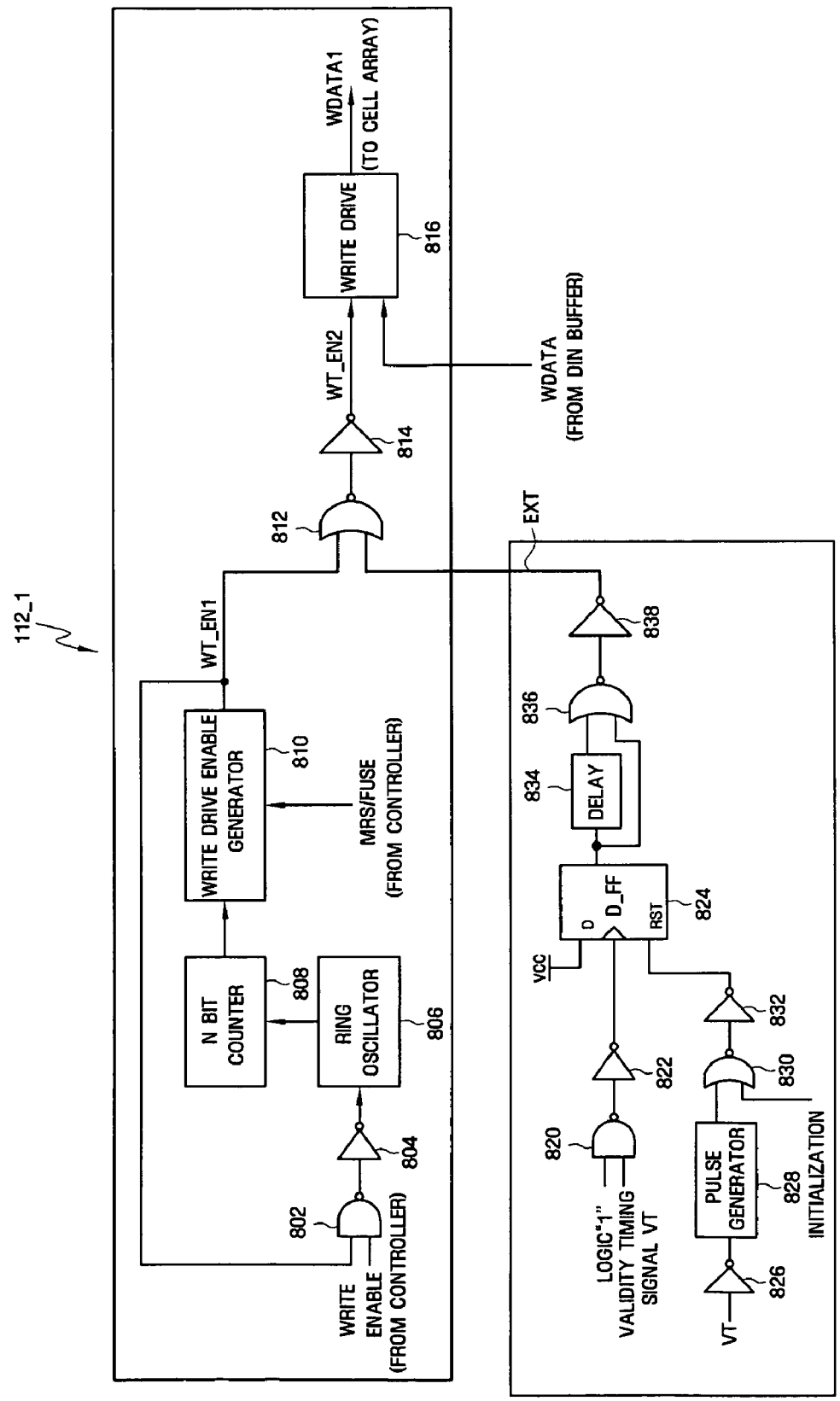
FIGS. 15A and 15B illustrate example embodiments of the write circuit in FIG. 14.

FIG. 14 illustrates a semiconductor device according to another embodiment. As shown, the embodiment of FIG. 14 is the same as the embodiment of FIG. 1, except that the write address buffer 124 does not generate and supply a last entry flag lef to the write circuit 112-1, and the write circuit 112-1 has replaced the write circuit 112 of FIG. 1. FIG. 15A illustrates one embodiment of the write circuit 112-1. As shown, the write circuit 112-1 is the same as the write circuit 112 shown in FIG. 8 except that the last entry flag lef input to the NAND gate 820 has been replaced by a logic high (or logic "1") value.

As will be appreciated, in this embodiment, the write circuit 112-1 will lengthen the write cycle when writing each write data WDATA such that each write data settles prior to the next read or write operation. Namely, each write operation will be extended until expiration of the validity time period.

Figure 15B:
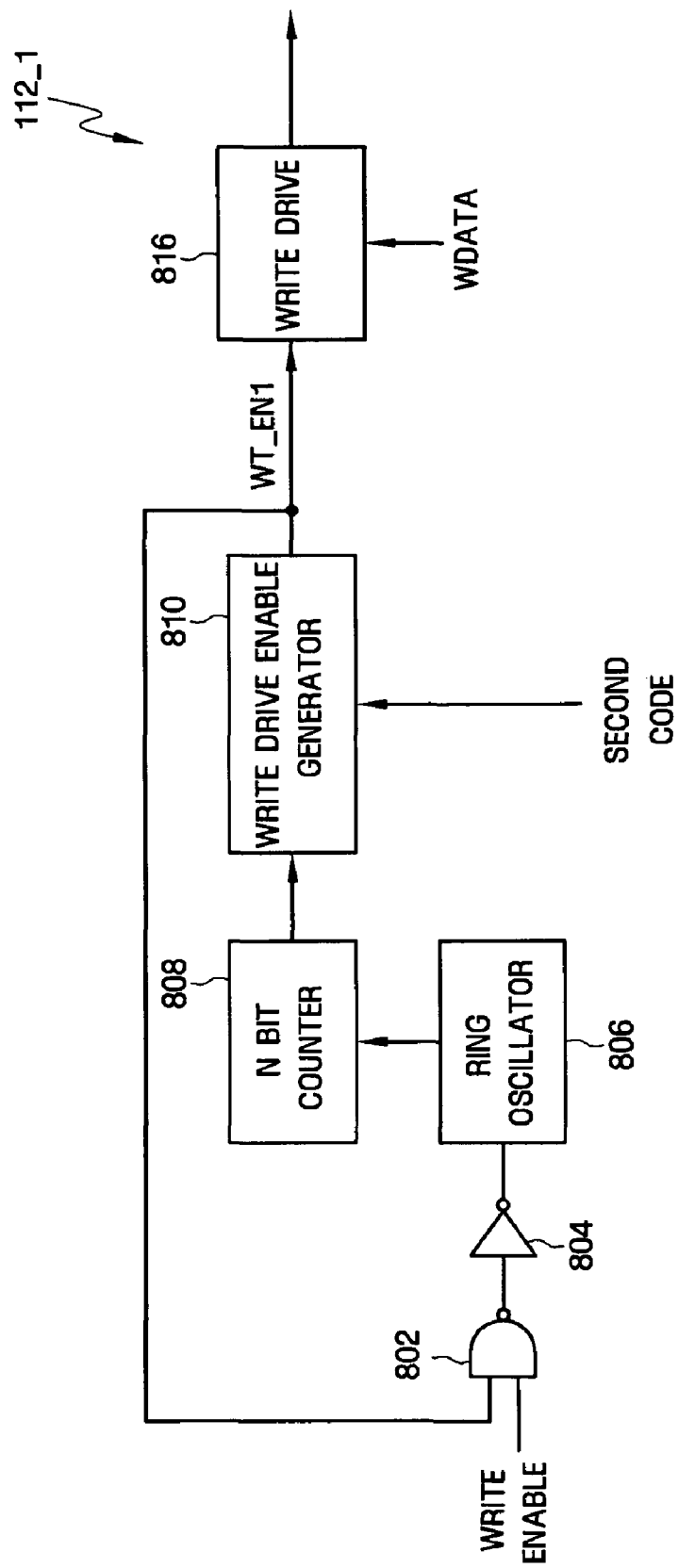

FIG. 15B illustrates another embodiment of the write circuit 112-1 in FIG. 14. The embodiment of FIG. 15B is the same as the embodiment of FIG. 12 except that the selector 840 and AND gate 842 have been eliminated, and the second code is supplied to the write driver enable generator 810. Instead of supplying the second code, the write driver enable generator 810 may be programmed to set the length of the first write driver enable signal WT_EN1 to the second enable period in the embodiment of FIG. 12 such as through fuses, etc.

FIG. 16 illustrates a flow chart of the write operation for the embodiment of FIG. 14. As shown, steps S1310 and S1315 are preformed in the same manner as steps S810 and S815 discussed above with respect to FIG. 10. Then, in step S1320, the write cycle or write time period is increased until expiration of the validity time period. The write data WDATA is written into the memory cell array 102 in step S1325 in the same manner discussed above with respect to step S830 in FIG. 10.

Figure 17:
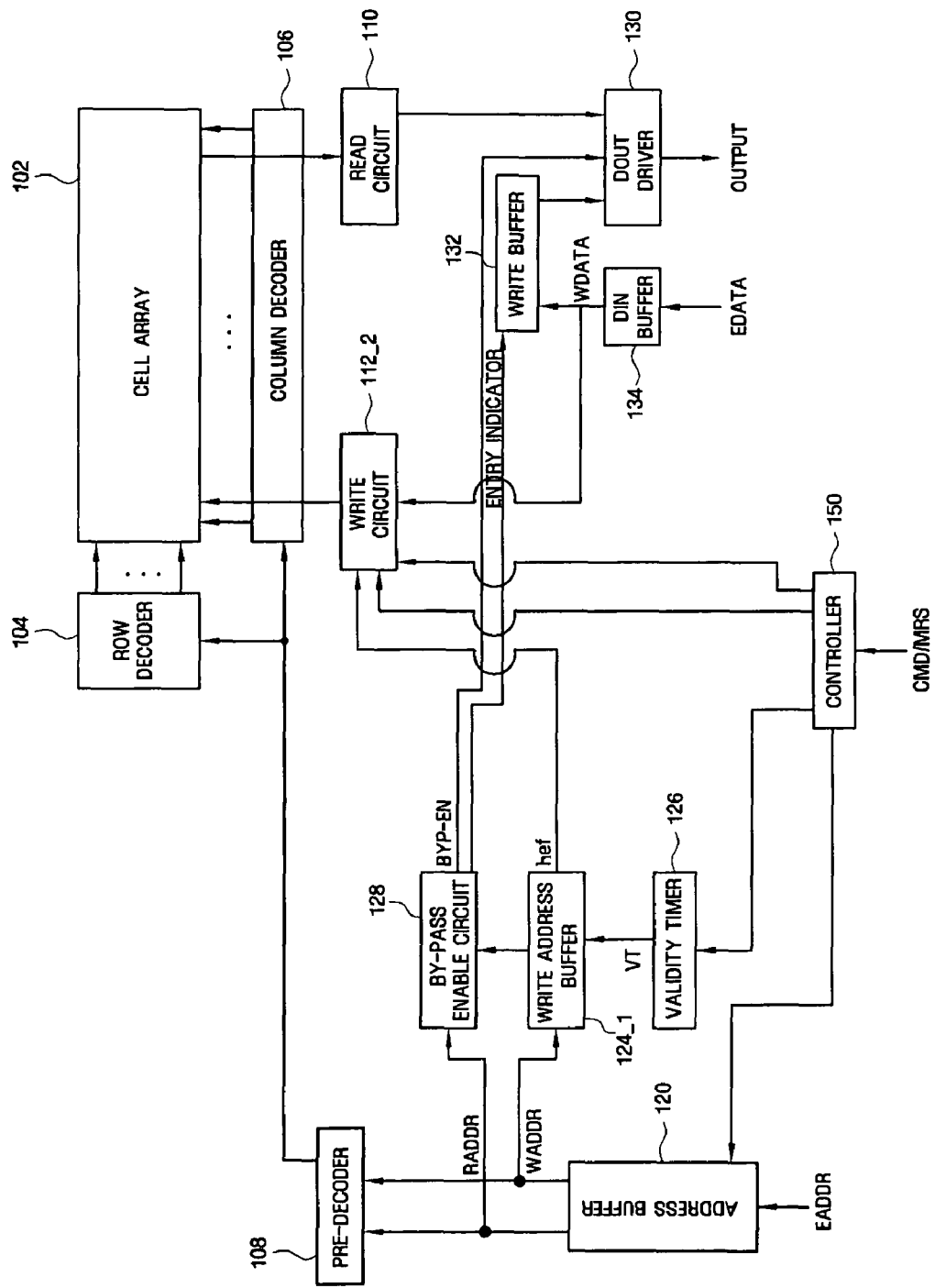
FIG. 17 illustrates a semiconductor device according to another embodiment.

FIG. 17 illustrates a semiconductor device according to further embodiment. As shown, the embodiment of FIG. 17 is the same as the embodiment of FIG. 1, except that the write address buffer 124-1 has replaced write address buffer 124 and the write circuit 112-2 has replaced the write circuit 112 of FIG. 1.

The write address buffer 124-1 is the same as the write address buffer 124 except that instead of generating the last entry flag lef, the write address buffer 124-1 generates a highest entry flag hef. The highest entry flag hef indicates the highest numbered entry (1 through m, with m being the largest) storing a valid write address. Stated another way, the highest entry flag hef indicates the entry storing the most recent write address and/or write data.

Figure 18:
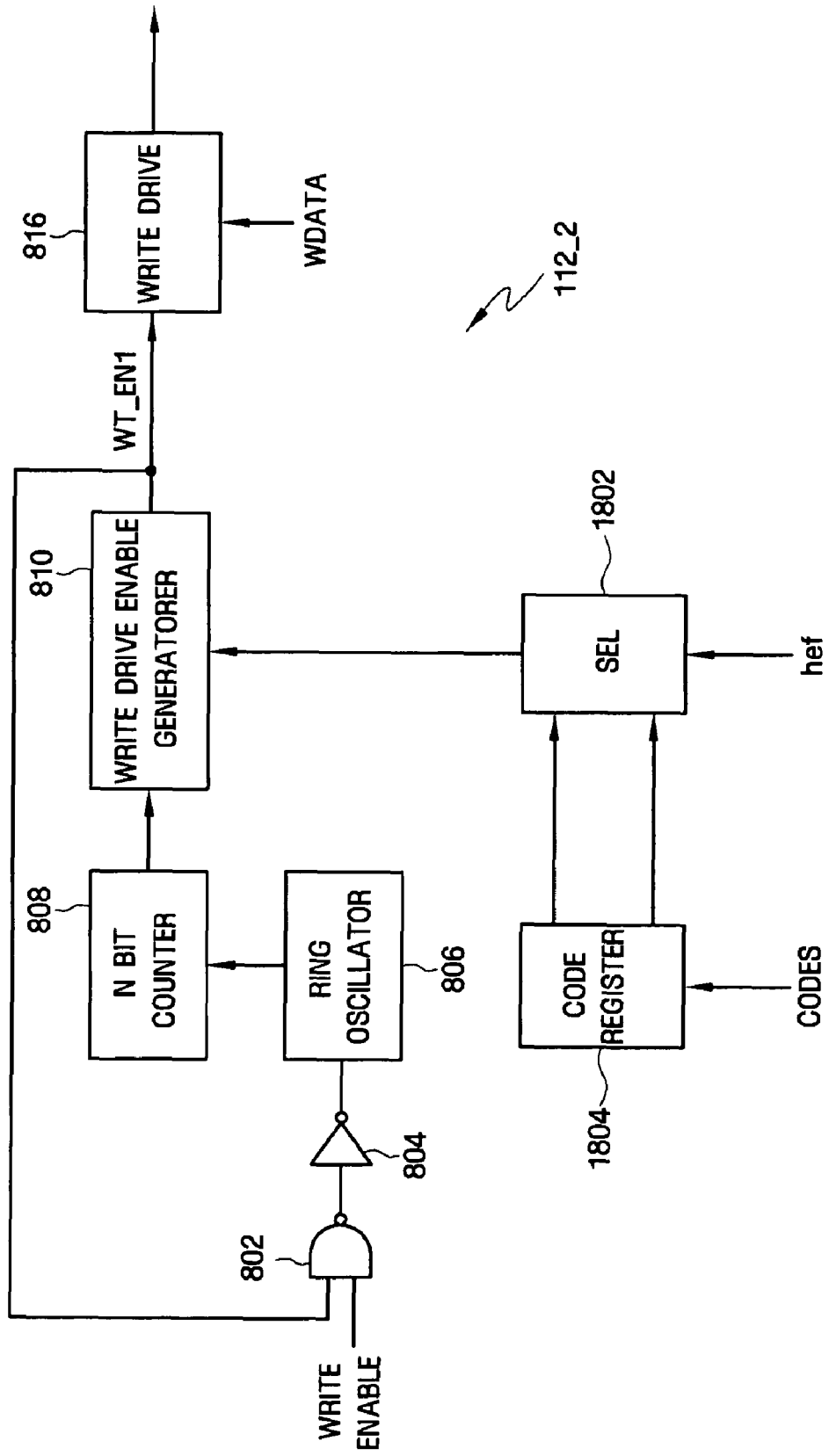
FIG. 18 illustrates an example embodiment of the write circuit in FIG. 16.

FIG. 18 illustrates an embodiment of the write circuit 112-2. As shown, the write circuit 112-2 is the same as the write circuit embodiment of FIG. 12 except that the selector 840 has been replaced with a selector 1802, the AND gate 842 has been eliminated, and a code register 1804 has been added. Accordingly, only the differences between the embodiment of FIG. 18 and the embodiment of FIG. 12 will be described for the sake of brevity.

As shown in FIG. 18, the controller 150 programs the code register 1804 to store a plurality of codes. In particular, the code register 1804 stores m codes, each associated with the corresponding entries in the write address buffer 124-1 and the write buffer 132. Stated another way, each code corresponds to one of the first to mth write cycles, and sets forth the time period that the first write driver enable signal WT_EN1 will be logic high for the corresponding write cycle.

The selector 1804 selectively outputs one of the m codes from the code register 1804 to the write driver enable generator 810 based on the highest entry flag hef. Namely, the code corresponding to the entry indicated by the highest entry flag hef is selected and output. The codes may be set such that the cumulative extensions of the write cycles provide some level of confidence that the write data settles in the memory cell array 102 prior to being overwritten in the write buffer 132.

The codes may be programmed into the code register 1804 by applying commands/mode register sets to the controller 150. As will be appreciated, this provides greater flexibility in setting the write cycle times and permits optimizing the performance of the semiconductor device depending on the particular application thereof. For example, only one of the write cycle periods may differ from the other write cycle periods, or all of the write cycle periods may differ. And, somewhere between one and all of the write cycle periods may differ. Stated another way, this embodiment permits independent control of each write cycle period.

A still further embodiment includes a non-volatile memory cell array, a write buffer configured to store data being written into the non-volatile memory cell array, and a write unit configured to write data into the non-volatile memory cell array. The write unit is configured to perform writing of data such that each data will have reached a stable storage state in the non-volatile memory prior to being over-written in the write buffer.

According to another embodiment, the code register 1804 of FIG. 18 may be enlarged to store multiple sets of m codes. The code register 1804 may be programmed or pre-programmed with the different sets of m codes. Each set of codes provides for a different set of write cycle time periods, and corresponds to a different operation mode. For example, a set of codes for a first mode may be programmed such that the first through (m−1)th write cycle time periods are set to tTW and the mth write cycle period is set equal the expected recovery time period tRCV of FIG. 1. As such, the first mode results in an equivalent operation to that discussed above with respect to FIGS. 1 and 10. The set of codes for a second mode may be programmed such that the first through mth write cycle periods are set equal to the expected recovery time period tRCV of FIG. 1. As such, the second mode results in an equivalent operation to that discussed above with respect to FIGS. 14 and 16. Still further, a command or mode register set may be supplied to the controller 150 indicating the operational mode. In response, the controller 150 notifies the mode register 1804 of the operation mode, and the mode register 1804 outputs the set of codes associated with that operation mode.

Figure 19:
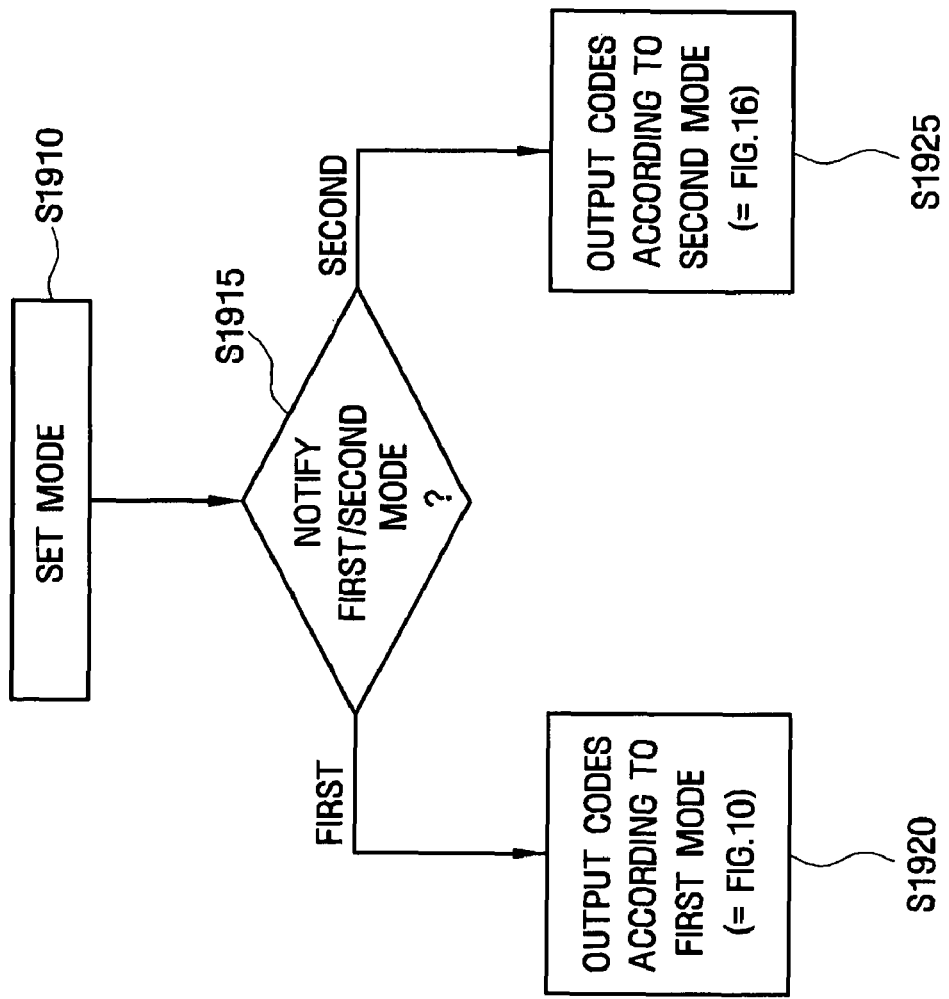
FIG. 19 illustrates of flowchart of a write operation according to another embodiment.

As such, operation in this manner proceeds as shown in FIG. 19. As shown, in step S1910, the operation mode is set by applying a command and/or mode register set to the controller 150. The controller 150 in turn notifies the mode register 1804 in step S1915 of the operation mode. If the controller 150 notifies the mode register 1804 that the first mode has been selected, then the mode register 1804 outputs the set of codes established for the first mode in step S1920 such that operation is equivalent to that of FIGS. 1 and 10. However, if the controller 150 notifies the mode register 1804 that the second mode has been selected, then the mode register 1804 outputs the set of codes established for the second mode in step S1925 such that operation is equivalent to that of FIGS. 14 and 16. As will be appreciated, more than the first and second modes may be programmed into the mode register 1804.

Figure 20:
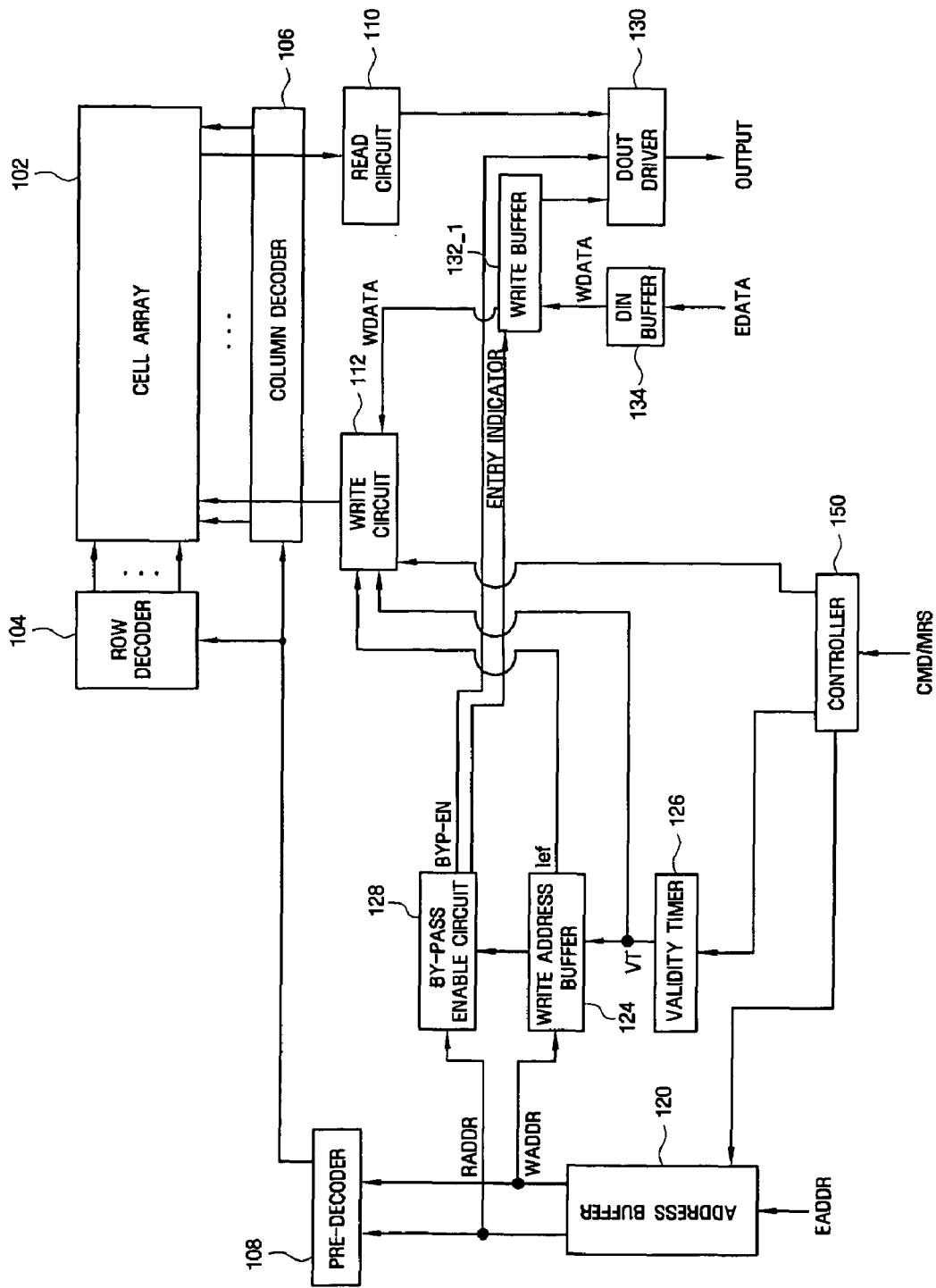
FIGS. 20-22 illustrate still further embodiments of a semiconductor device.

FIG. 20 illustrates a semiconductor device according to a still further embodiment. This embodiment may be the same as any of the above described embodiments, except that the write buffer 132-1 is a pass-through write buffer. For the purposes of explanation only, FIG. 20 shows the semiconductor device of FIG. 1 with the write buffer 132-1. As shown, in this embodiment, the write data WDATA is supplied to the write circuit 112 from the pass-through write buffer 132 instead of from the data input buffer 134 as in FIG. 1.

Figure 21:
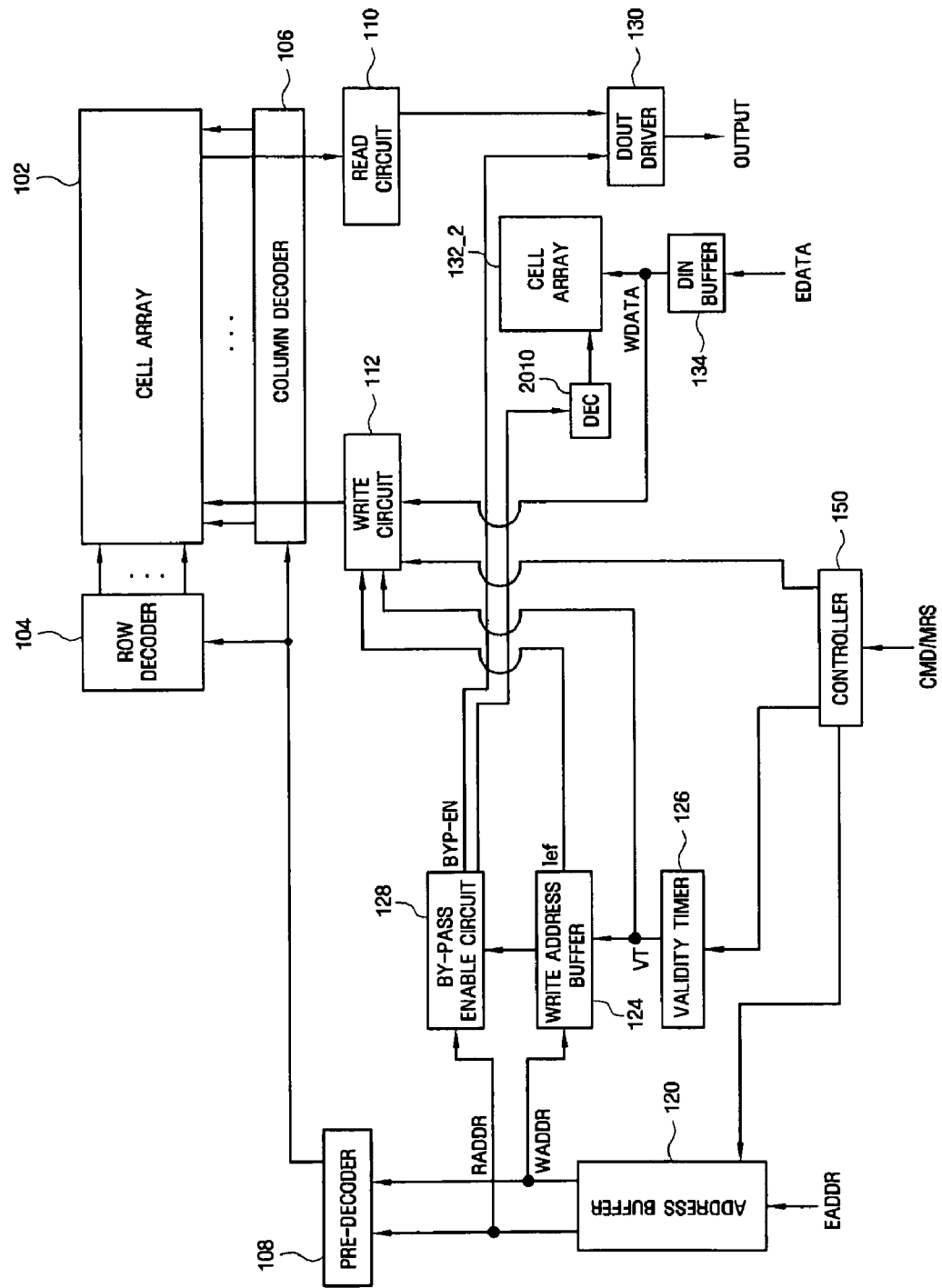

FIG. 21 illustrates a semiconductor device according to another embodiment. This embodiment may be the same as any of the above described embodiments, except that the write buffer 132-2 is a memory cell array. Namely, the write buffer 132-2 may be a non-volatile memory cell array of a different type than the memory cell array 102. For example, the memory cell array of the write buffer 132-2 may be a dynamic random access memory (DRAM), a static random access memory (SRAM), etc. that has a settling time less than the memory cell array 102. It will also be appreciated that the memory cell array of the write buffer 132-2 is smaller than the memory cell array 102. For the purposes of explanation only, FIG. 21 shows the semiconductor device of FIG. 1 with the write buffer 132-2. As shown, in this embodiment, a decoder 2010 performs the same functions of a pre-decoder, row decoder and column decoder with respect to the write buffer 132-2, and decodes the entry indicated by the entry indicator output from by the by-pass control unit 128 to drive word lines and column selectors of the write buffer 132-2. Otherwise the operation of this embodiment is the same as any of the above described embodiments.

Figure 22:
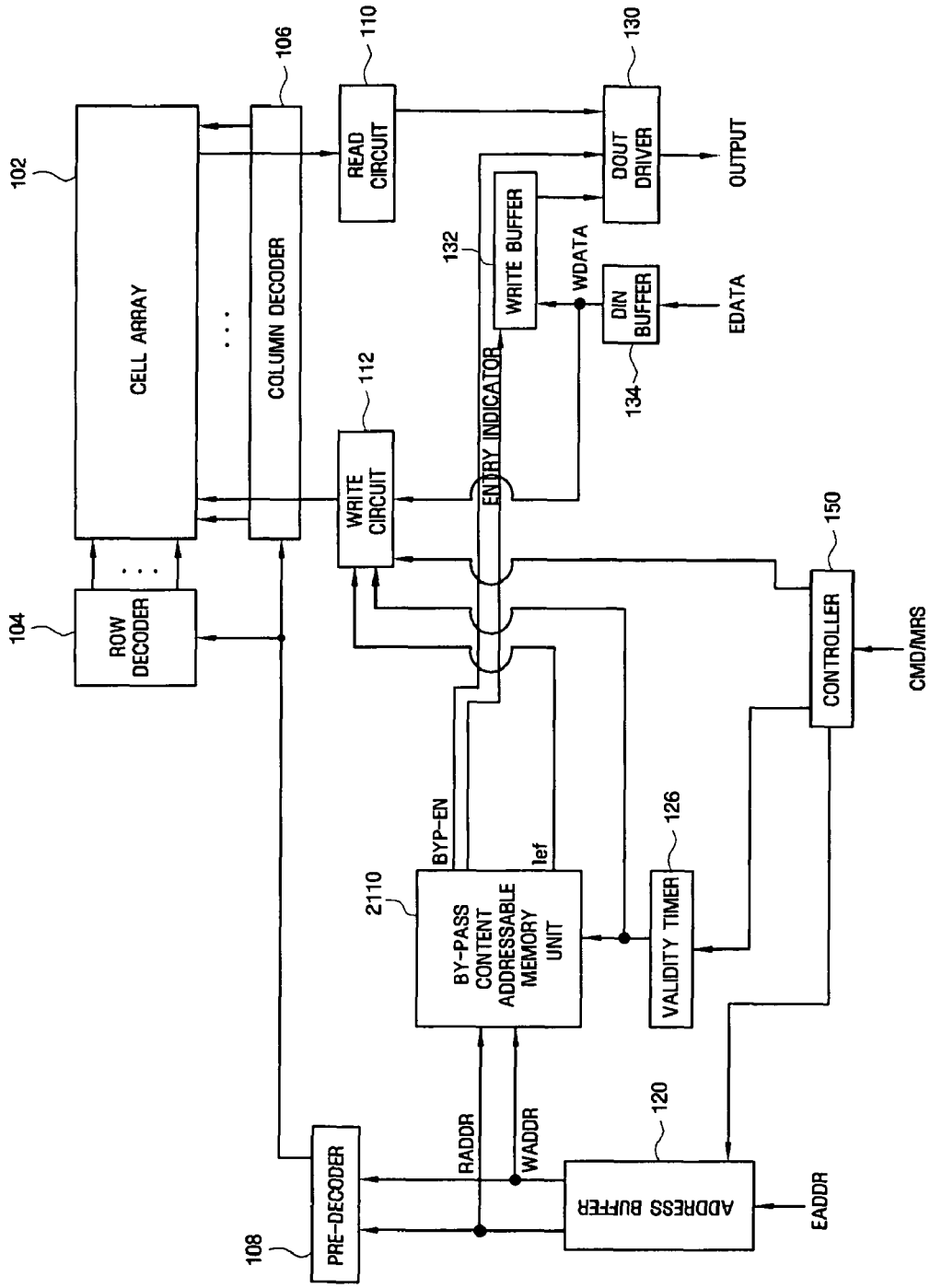

FIG. 22 illustrates a semiconductor device according to yet another embodiment. This embodiment may be the same as any of the above described embodiments, except that the by-pass control unit 128 and the write address buffer 124 have been replaced with a by-pass content addressable memory (CAM) unit 2110. For the purposes of explanation only FIG. 22 shows the semiconductor device of FIG. 1 with the by-pass CAM unit 2110. A CAM is a well-known type of memory that may receive data, and output an address in which matching data is already stored. Accordingly, in this embodiment, the by-pass CAM unit 2110 stores the write addresses WADDRs output by the address buffer 120. The by-pass CAM unit 2110 also stores an associated validity flag with the stored write addresses, and resets the validity flags based on output from the validity timer 126 in the same manner as discussed with respect to the write address buffer 124. However, in this embodiment, the by-pas CAM unit 2110 inputs the read address RADDR into the CAM and generates the entry address, which is then sent as the entry indicator to the write address buffer 134. As will be appreciated, the write address buffer 134 may be addressable in the same fashion as the CAM. For example, the write address buffer 134 may be implemented as a memory array as described above with respect to FIG. 21. Alternatively, the write address buffer 134 storage locations may have addresses corresponding to those in the CAM. As a further alternative, a translation unit may be added to translate the output address into an entry location in the write address buffer 134.

Figure 23:
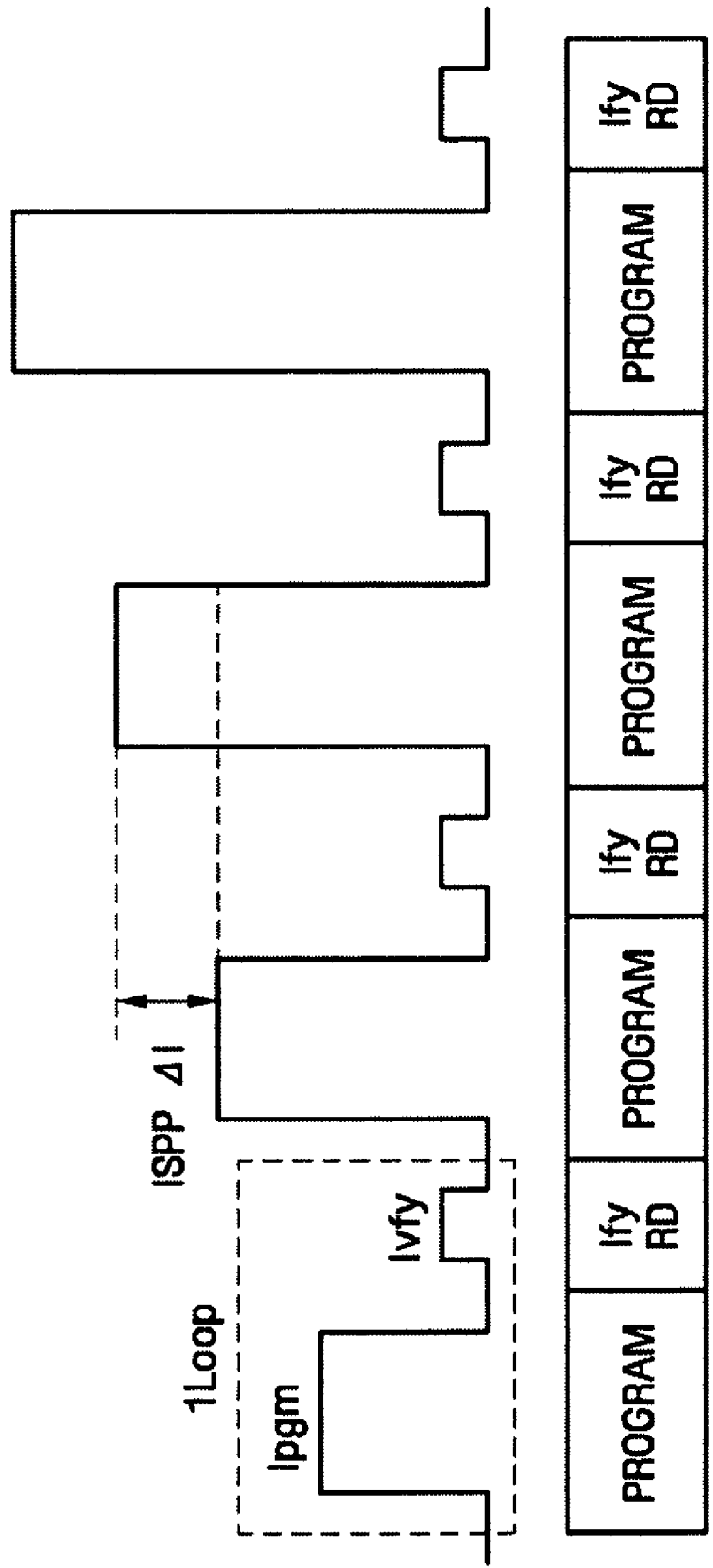
FIG. 23 illustrates a program loop including a plurality of unit program loops using an ISPP method.

It will further be appreciated that the write operation in any of the above embodiments may be a incremental program pulse (ISPP) method as shown in FIG. 23. In particular, FIG. 23 illustrates a program loop including a plurality of unit program loops using an ISPP method. As illustrated in FIG. 23, one unit program loop may include a program operation and a verify read operation. In the program operation, a program current or current waveform Ipgm may be applied to a memory cell. While shown as a simple square wave, it will be appreciated that the program current waveform may be of a shape to either set or reset the phase change material in the memory cell Cp. In the verify read operation, a verify current Ivfy may be applied to the selected memory cell. In ISPP fashion, the program current Ipgm may be increased by a delta current for each unit program loop. Once the verify read operation verifies that data has been properly written, the program loops ends, and the write operation ends. Namely, until verified the write operation is not complete.

It will be understood that FIG. 23 is but one example method of ISPP and that any ISPP method may be used to in the write operation. For example, instead or in addition to adjusting the current magnitude, the duration the current is applied may be changed. Still further, instead of or in addition to the current magnitude and/or the current duration, the waveform shape may be changed.

Still further, it will be appreciated that the memory cells Cp may serve as multi-level cells (MLC). Here instead of just the set and reset states, the memory cell Cp may be programmed to states between the set and reset state such that the memory cell Cp stores more than 1 bit of data. For example, if four states exist, each state may represent two bits of data.

Furthermore, the present invention is not limited to any particular cell array structure, or use of a particular cell array structure with a particular resistance material based memory. Instead, any cell structure such as 3D, crosspoint, wafer stack, etc. may be implemented in the embodiments of the present invention. U.S. Pat. No. 6,351,406 discloses such an example cell structure, and is incorporated by reference herein in its entirety.

Application Embodiments

Figure 24:
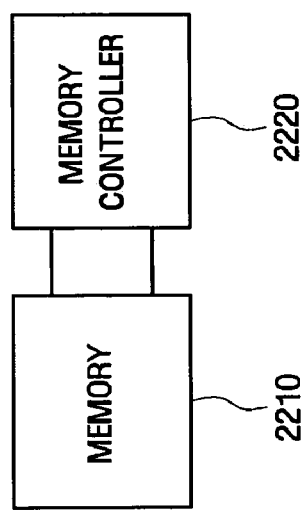
FIGS. 24-29 illustrate example embodiments of applications of the semiconductor device.

FIG. 24 illustrates an example embodiment of an application of the semiconductor device. As shown, this embodiment includes a memory 2210 connected to a memory controller 2220. The memory 2210 may be any of the semiconductor device embodiments described above. The memory controller 2220 supplies the input signals for controlling operation of the memory 2210. For example, the memory controller 2220 supplies the command CMD and address signals.

Figure 25:
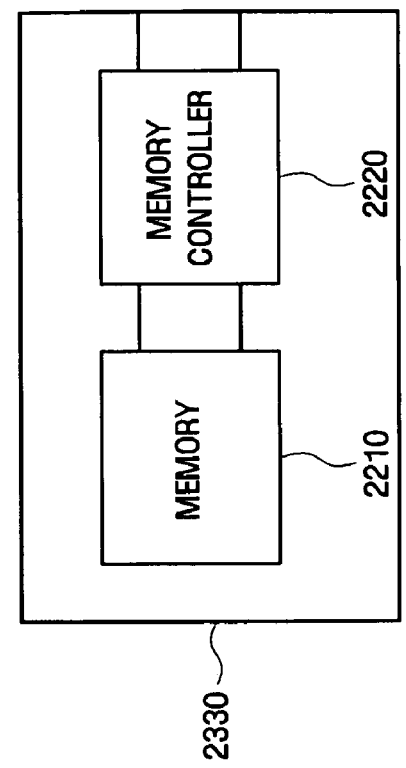

FIG. 25 illustrates yet another embodiment. This embodiment is the same as the embodiment of FIG. 24, except that the memory 2210 and memory controller 2220 have been embodied as a card 2330. For example, the card 2330 may be a memory card such as a flash memory card. Namely, the card 2330 may be a card meeting any industry standard for use with a consumer electronics device such as a digital camera, personal computer, etc. It will be appreciated that the memory controller 2220 may control the memory 2210 based on controls signals received by the card 2330 from another (e.g., external) device.

Figure 26:
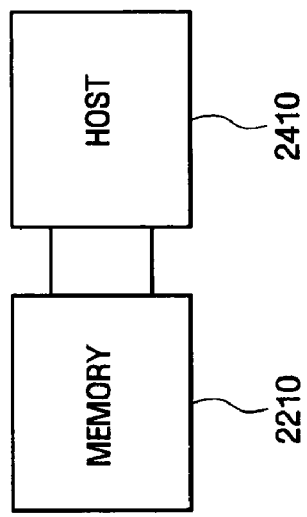

FIG. 26 illustrates a still further embodiment of the present invention. As shown, the memory 2210 may be connected with a host system 2410. The host system 2410 may be a processing system such as a personal computer, digital camera, etc. The host system 2410 may use the memory 2210 as a removable storage medium. As will be appreciated, the host system 2410 supplies the input signals for controlling operation of the memory 2210. For example, the host system 2410 supplies the command CMD and address signals.

Figure 27:
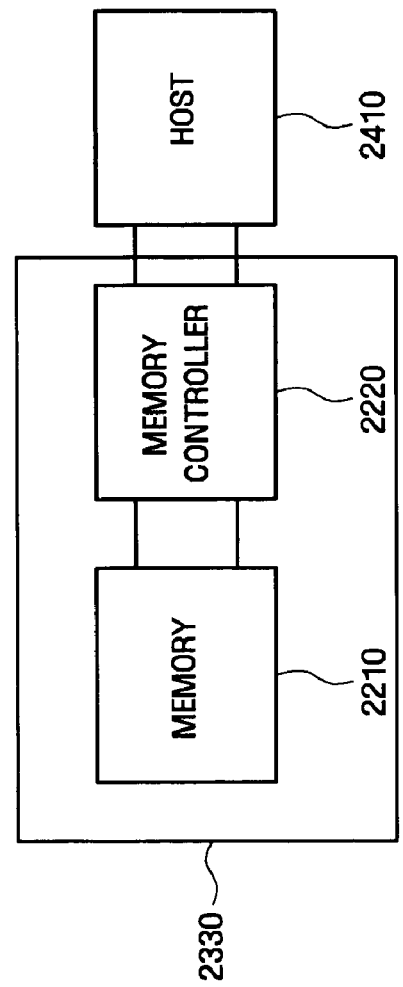

FIG. 27 illustrates an embodiment of the present invention in which the host system 2410 is connected to the card 2330 of FIG. 25. In this embodiment, the host system 2410 applies control signals to the card 2330 such that the memory controller 2220 controls operation of the memory 2210.

Figure 28:
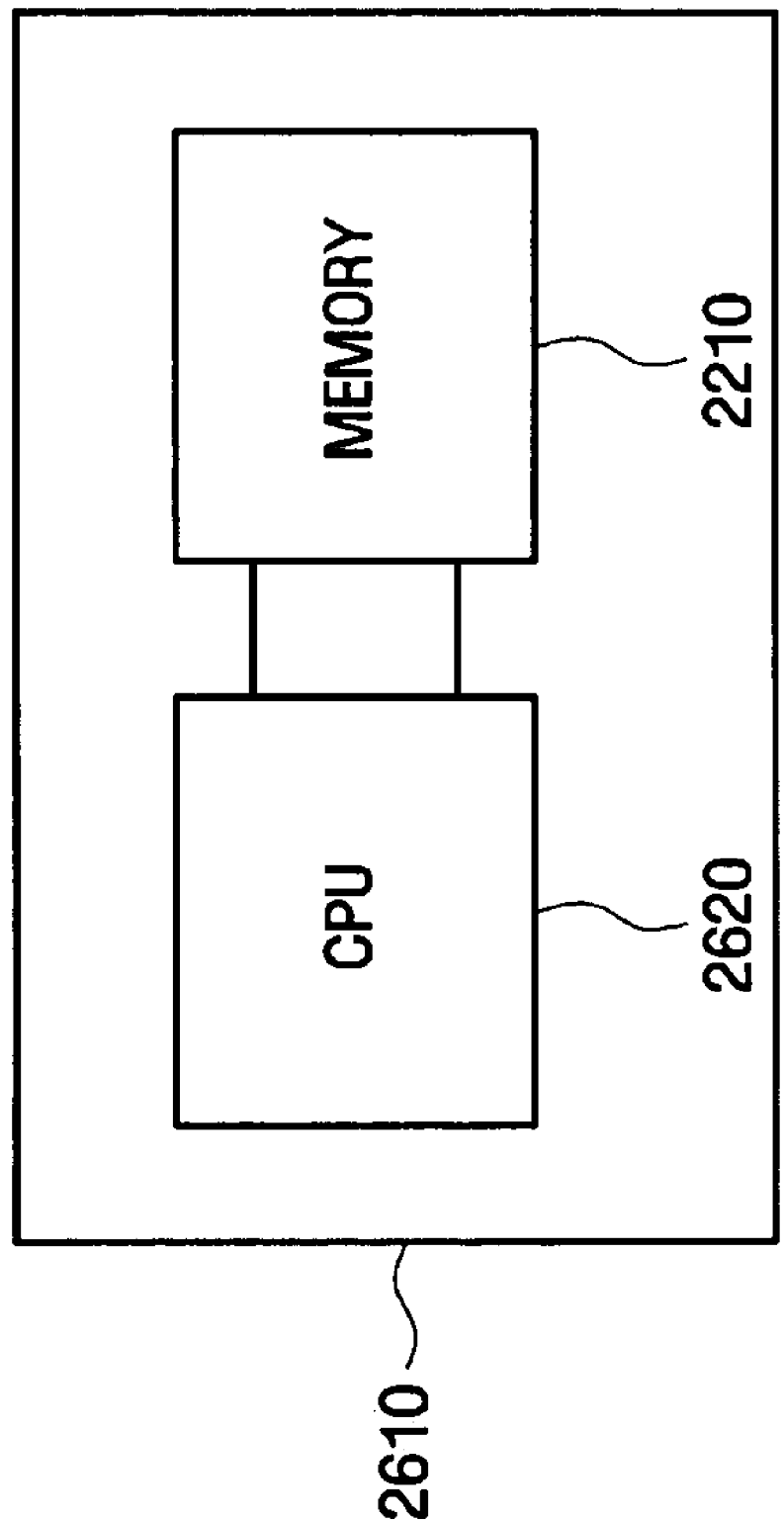

FIG. 28 illustrates a further embodiment of the present invention. As shown, the memory 2210 may be connected to a central processing unit (CPU) 2620 within a computer system 2610. For example, the computer system 2610 may be a personal computer, personal data assistant, etc. The memory 2210 may be directly connected with the CPU 2620, connected via bus, etc. It will be appreciated, that FIG. 28 does not illustrate the full complement of components that may be included within a computer system 2610 for the sake of clarity.

Figure 29:
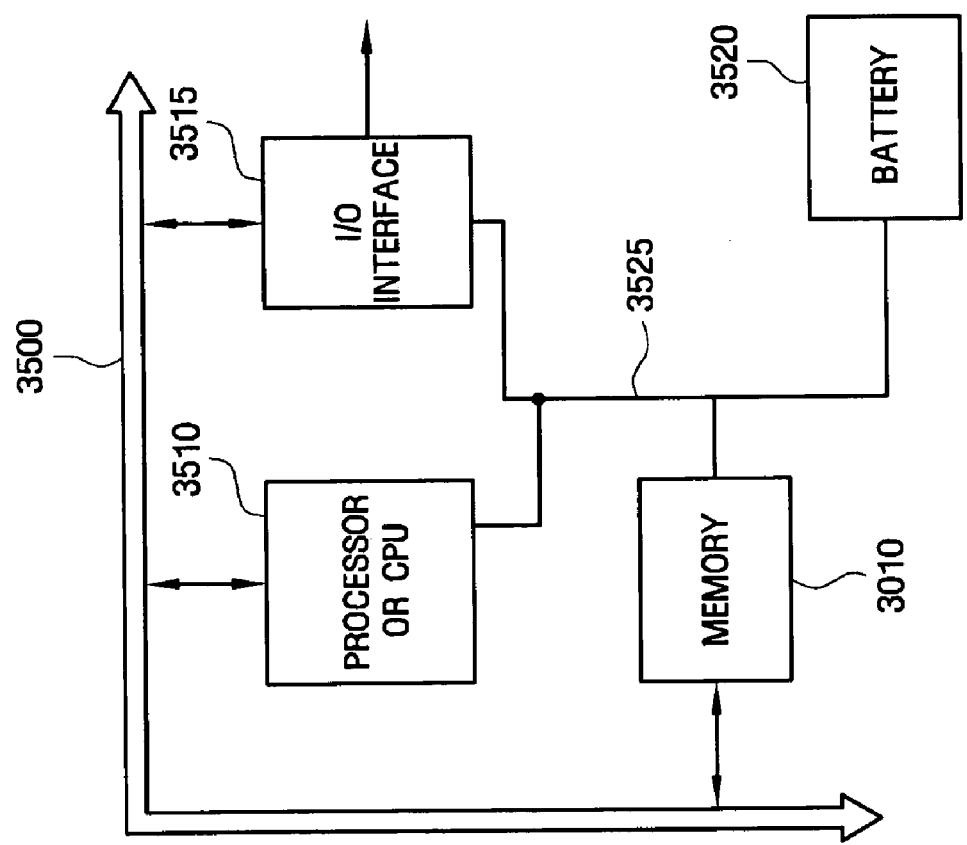

FIG. 29 illustrates another embodiment of the present invention. FIG. 29 may represent another portable application of the semiconductor device embodiments described above. As shown, this embodiment includes the memory 3010, which may be any of the semiconductor device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 29, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 29. Furthermore, the present invention is not limited to this architecture. For example, the memory 3010 may be replaced with the embodiment of FIG. 25, and communication with the processor 3510 may be via the memory controller 3020. Furthermore, the I/O interface 3515 may communicate with the memory 3010 via the memory controller 3020, or directly with the memory 3010 if the memory controller 3020 is not present. In portable applications, the above-described components are powered by a battery 3520 via a power supply bus 3525.

The invention being thus described, it will be obvious that the same may be varied in many ways. Such variations are not to be regarded as a departure from the invention, and all such modifications are intended to be included within the scope of the invention.

We claim:

1. A semiconductor device, comprising:
   a first non-volatile memory cell array;
   a write buffer configured to store data being written into the non-volatile memory cell array;
   an address buffer configured to store an address associated with each data stored in the write buffer;
   a timing circuit configured to measure at least a first time period;
   an output circuit configured to selectively output one of data read from the non-volatile memory array and data from the write buffer; and
   a by-pass control circuit configured to control the output circuit based on output from the timing circuit, a received read address and content of the address buffer.

2. The semiconductor memory device of claim 1, further comprising:
   a write circuit configured to write data in the non-volatile memory cell array; and
   an input buffer configured to supply input data to the write circuit.

3. The semiconductor memory device of claim 1, further comprising:
   a write circuit configured to write data in the non-volatile memory cell array; and wherein
   the write buffer is configured to supply data for writing to the write circuit.

4. The semiconductor device of claim 1, wherein the write buffer is a second non-volatile memory array having different cell type than the first non-volatile memory cell array, and a size of the second non-volatile memory cell array is less than the first non-volatile memory cell array.

5. The semiconductor device of claim 4, wherein the first non-volatile memory cell array includes phase change memory cells.

6. The semiconductor device of claim 1, wherein the address buffer and at least a portion of the by-pass control circuit are embodied as a content addressable memory.

7. The semiconductor device of claim 1, wherein a length of the first time period is equal to or greater than an amount of time for data written in the first non-volatile memory cell array to stabilize.

8. The semiconductor device of claim 7, wherein the timing circuit is triggered to measure the first time period by receipt of a write command.

9. The semiconductor device of claim 8, wherein
the address buffer is configured to set a validity flag when storing an address, and is configured to reset the validity flags of each stored address when the first time period expires; and
the by-pass control circuit is configured to control the output circuit to output data from the write buffer if the received read address matches a write address stored in the address buffer, and the validity flag for the matching write address is set.

10. The semiconductor device of claim 1, further comprising:
a write circuit configured to write the data into the non-volatile memory cell array, and the write circuit configured to perform writing of data such that each data will have reached a stable storage state in the non-volatile memory cell array prior to being over-written in the write buffer.

11. The semiconductor device of claim 10, wherein the write circuit is configured to selectively increase a time to write one or more data.

12. The semiconductor device of claim 11, wherein the write circuit is configured to selectively increase a time to write data filling a last entry in the write buffer as compared to write data filling other entries of the write buffer.

13. A method of reading data from a semiconductor device, comprising:
storing data being written into a non-volatile memory cell array in a write buffer;
storing an address associated with the stored data in an address buffer;
measuring at least a first time period;
selectively outputting one of data read from the non-volatile memory cell array and data from the write buffer based on the first time period, a received read address and content of the address buffer.

* * * * *